(12) United States Patent
Ishikawa et al.

(10) Patent No.: US 11,802,322 B2
(45) Date of Patent: Oct. 31, 2023

(54) METHOD FOR MANUFACTURING SOLDER PRODUCT, SOLDER, SOLDERED COMPONENT, PRINTED WIRING BOARD, PRINTED CIRCUIT BOARD, WIRE, SOLDERED PRODUCT, FLEXIBLE PRINTED BOARD, ELECTRONIC COMPONENT, METHOD FOR MANUFACTURING TIN ARTICLE, METHOD FOR MANUFACTURING TIN INTERMEDIATE PRODUCT, TIN INTERMEDIATE PRODUCT, AND CONDUCTIVE MEMBER

(71) Applicants: ISHIKAWA TECHNOLOGY LABORATORY CO., LTD., Tochigi (JP); KAYABA OFFICE CO., LTD., Saitama (JP); Akira Ogihara, Kanagawa (JP)

(72) Inventors: Hisao Ishikawa, Tochigi (JP); Masao Kayaba, Saitama (JP); Akira Ogihara, Kanagawa (JP)

(73) Assignees: ISHIKAWA TECHNOLOGY LABORATORY CO., LTD., Tochigi (JP); KAYABA OFFICE CO., LTD., Saitama (JP); Akira Ogihara, Kanagawa (JP)

( * ) Notice: Subject to any disclaimer, the term of this patent is extended or adjusted under 35 U.S.C. 154(b) by 13 days.

(21) Appl. No.: 17/496,756

(22) Filed: Oct. 7, 2021

(65) Prior Publication Data
US 2022/0025484 A1 Jan. 27, 2022

Related U.S. Application Data

(63) Continuation of application No. PCT/JP2020/015963, filed on Apr. 9, 2020.

(30) Foreign Application Priority Data

Apr. 9, 2019 (JP) ................................ 2019-074215
Mar. 12, 2020 (JP) ................................ 2020-043538
(Continued)

(51) Int. Cl.
*C22C 1/02* (2006.01)
*C22C 13/00* (2006.01)
(Continued)

(52) U.S. Cl.
CPC .............. *C22C 1/02* (2013.01); *B23K 35/262* (2013.01); *C22C 13/00* (2013.01); *H05K 1/181* (2013.01);
(Continued)

(58) Field of Classification Search
CPC ...................................................... C22C 1/02
See application file for complete search history.

(56) References Cited

U.S. PATENT DOCUMENTS 6,179,935 B1   1/2001  Yamashita et al.
6,676,726 B1   1/2004  Endo et al.
(Continued)

FOREIGN PATENT DOCUMENTS

JP    S5135620      3/1976
JP    2001181748    7/2001
(Continued)

OTHER PUBLICATIONS

"International Search Report (Form PCT/ISA/210) of PCT/JP2020/015963", dated Jun. 30, 2020, with English translation thereof, pp. 1-9.
(Continued)

*Primary Examiner* — Scott R Kastler
(74) *Attorney, Agent, or Firm* — JCIP GLOBAL INC.

(57) ABSTRACT

A solder product 20 includes: a lead-free solder part 21 containing tin as a main component and a metal element
(Continued)

other than lead as a secondary component; and a carboxylic acid having 10 to 20 carbons, the carboxylic acid being mainly distributed over the surface of the solder product 20 to form a surface layer 22. The carboxylic acid is preferably a fatty acid having 12 to 16 carbons, and more preferably a palmitic acid.

2 Claims, 22 Drawing Sheets

(30) Foreign Application Priority Data

Apr. 8, 2020 (JP) .................................. 2020-069965
Apr. 8, 2020 (JP) .................................. 2020-069966

(51) Int. Cl.
  *B23K 35/26* (2006.01)
  *H05K 1/18* (2006.01)
  *H05K 3/34* (2006.01)
  *B23K 101/42* (2006.01)
(52) U.S. Cl.
  CPC ........ *H05K 3/3463* (2013.01); *B23K 2101/42* (2018.08)

(56) References Cited

U.S. PATENT DOCUMENTS

| | | | |
|---|---|---|---|
| 8,138,576 B2* | 3/2012 | Ishikawa .............. | B23K 35/262 |
| | | | 257/E23.03 |
| 2003/0029273 A1* | 2/2003 | Endo ...................... | B22F 1/065 |
| | | | 75/340 |
| 2004/0035247 A1* | 2/2004 | Endo ...................... | B22F 1/065 |
| | | | 75/340 |
| 2018/0272476 A1 | 9/2018 | Xu et al. | |

FOREIGN PATENT DOCUMENTS

| | | |
|---|---|---|
| JP | 3296289 | 6/2002 |
| JP | 2005131703 | 5/2005 |
| JP | 2008272779 | 11/2008 |
| JP | 2009093944 | 4/2009 |
| JP | 2009197315 | 9/2009 |
| KR | 20150122508 | 11/2015 |

OTHER PUBLICATIONS

"International Preliminary Report on Patentability (Form PCT/IPEA/409) of PCT/JP2020/015963", published on Nov. 16, 2020, with English translation thereof, pp. 1-17.
"Office Action of India Counterpart Application", dated Mar. 25, 2022, p. 1-p. 6.

* cited by examiner

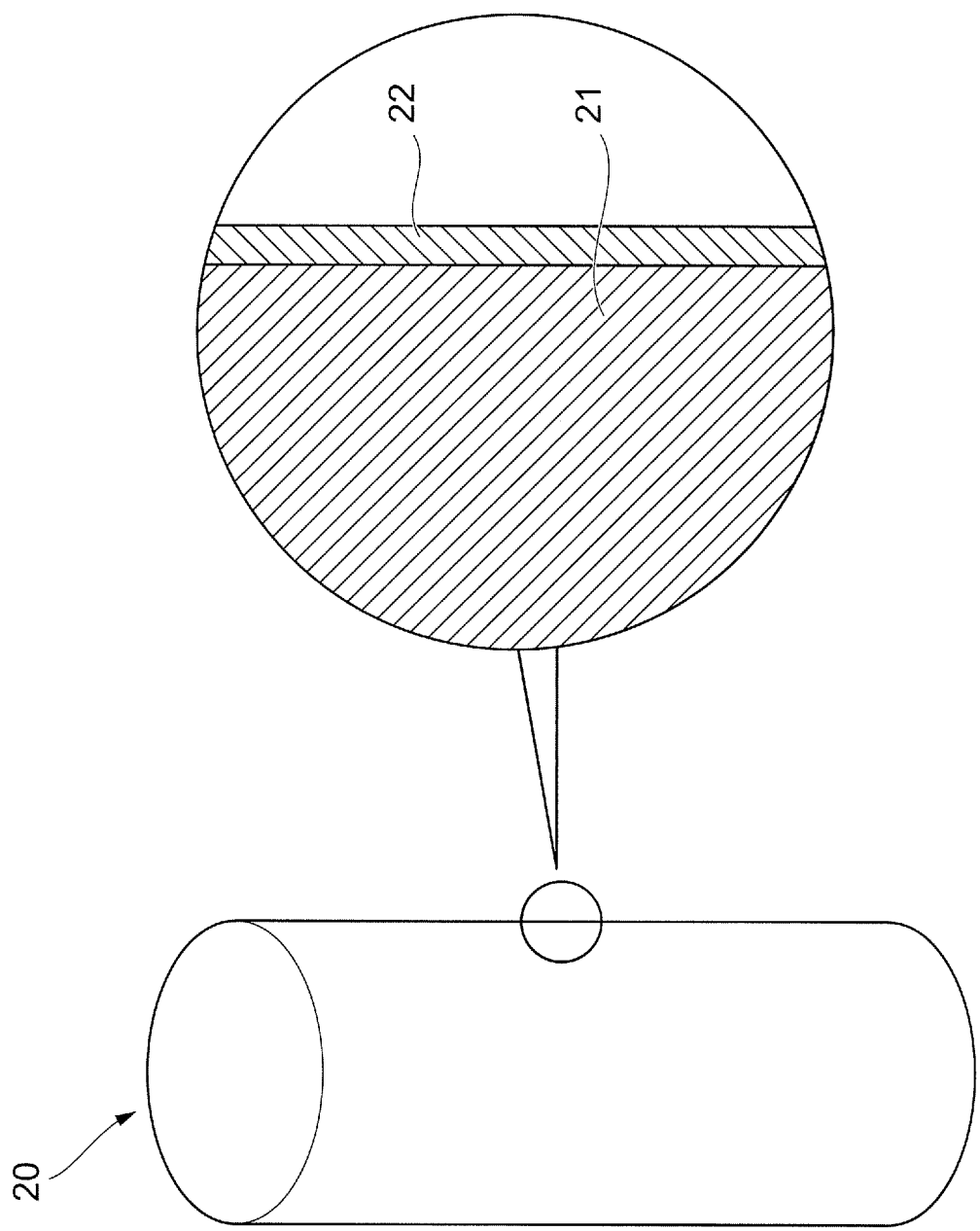

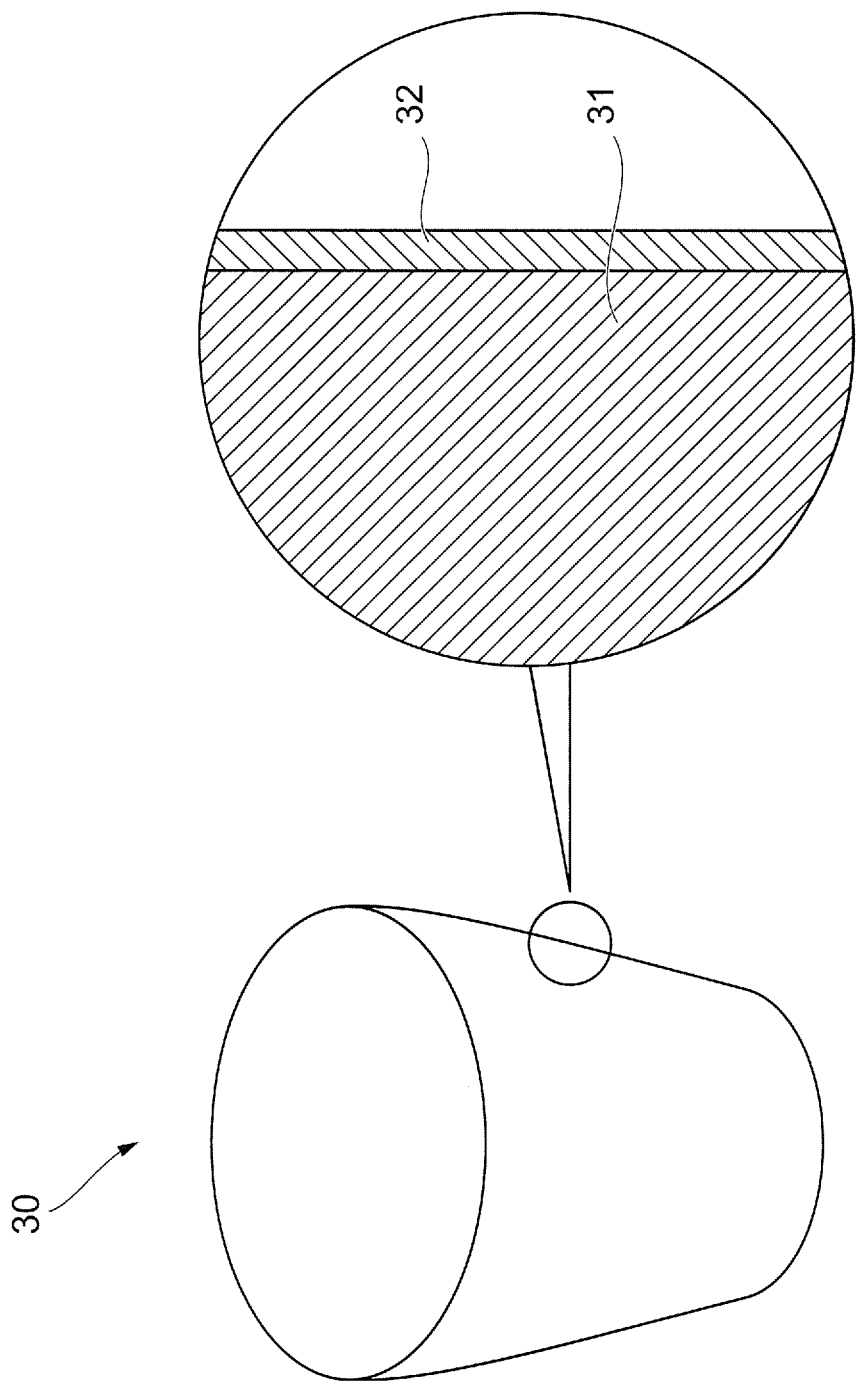

FIG.16A
FIG.16B
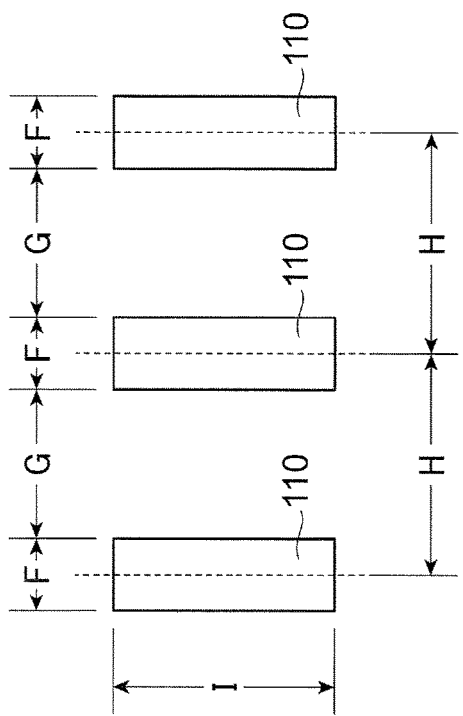
FIG.16C
| | F | G | H | I | (mm) |
|---|---|---|---|---|---|
| A | 0.2 | 0.5 | 0.7 | 15 | |
| B | 0.2 | 0.4 | 0.6 | 15 | |
| C | 0.2 | 0.3 | 0.5 | 15 | |
| D | 0.2 | 0.2 | 0.4 | 15 | |
| E | 0.15 | 0.15 | 0.3 | 15 | |
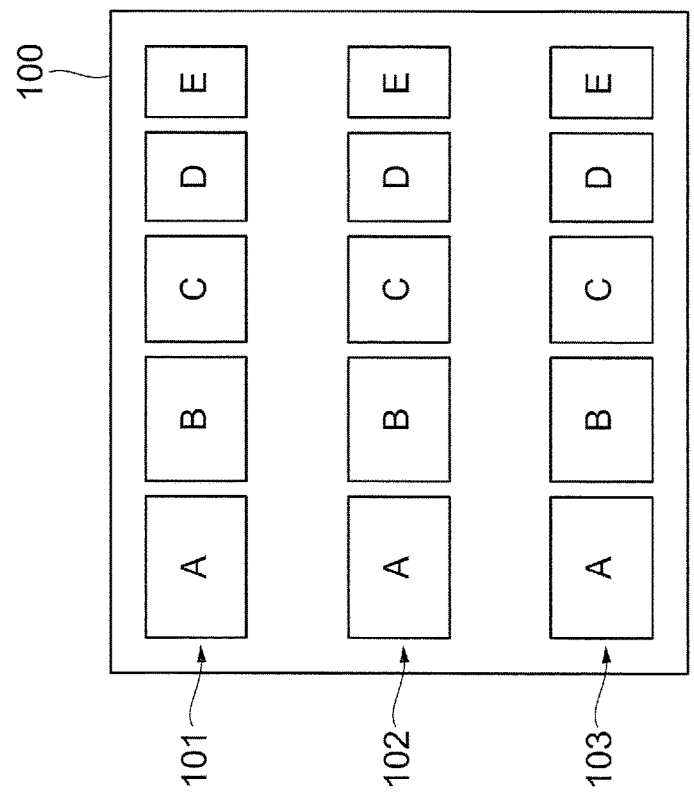

METHOD FOR MANUFACTURING SOLDER PRODUCT, SOLDER, SOLDERED COMPONENT, PRINTED WIRING BOARD, PRINTED CIRCUIT BOARD, WIRE, SOLDERED PRODUCT, FLEXIBLE PRINTED BOARD, ELECTRONIC COMPONENT, METHOD FOR MANUFACTURING TIN ARTICLE, METHOD FOR MANUFACTURING TIN INTERMEDIATE PRODUCT, TIN INTERMEDIATE PRODUCT, AND CONDUCTIVE MEMBER

CROSS-REFERENCE TO RELATED APPLICATION

This application is a continuation application of and claims priority benefit of a 371 application of an international PCT application serial no. PCT/JP2020/015963, filed on Apr. 9, 2020, which claims the priority benefit of Japan application JP2019-074215, filed on Apr. 9, 2019, Japan application JP2020-043538, filed on Mar. 12, 2020, Japan application JP2020-069965, filed on Apr. 8, 2020 and Japan application JP2020-069966, filed on Apr. 8, 2020. The entirety of the above-mentioned patent application is hereby incorporated by reference herein and made a part of this specification.

TECHNICAL FIELD

The present invention relates to a method for manufacturing a solder product, a solder, a soldered component, a solder product, a printed wiring board, a printed circuit board, a wire, a soldered product, a flexible printed board, an electronic component, a method for manufacturing a tin article, a method for manufacturing a tin intermediate product, a tin article, a tin intermediate product, and a conductive member

BACKGROUND ART

Patent Literature 1 discloses melting materials including Sn, Ag, Cu, Ni, and Sn—P alloy in an electric furnace to produce a (lead-free) solder alloy containing 1.0 to 4.0 wt. % of silver (Ag), up to 2.0 wt. % of copper (Cu), up to 0.5 wt. % of nickel (Ni), and up to 0.2 wt. % of phosphorus (P) with the balance of tin (Sn) and unavoidable impurities.

CITATION LIST

Patent Literature

Patent Literature 1: Japanese Patent No. 3296289

SUMMARY OF INVENTION

Technical Problem

A solder obtained by conventional soldering may have poor appearance, such as having protrusions and bumps formed thereon. Conventional soldering may also induce a phenomenon called a "solder bridge," in which a solder adhered to a particular portion is joined to another solder adhered to another portion. The solder bridge will cause a short-circuit between these joined solders.

Also, due to a recent trend towards precision-manufacturing of electronic circuit components, a need exists for an ability to solder micro components. In one specific example, a micro light-emitting diode (LED), which is a promising component for next generation displays and the like, has a width of about 150 μm. Thus, to produce a micro LED display, it is required to form a large number of solder pockets each with a width of about 50 μm and a depth of about 10 μm to 15 μm on a substrate and fill a solder into these solder pockets formed on the substrate to solder a large number of micro LEDs. In this case, if the molten solder contains solids, the solids may project from the solder pocket, with the result that the micro LED may be mounted on the substrate in an inclined fashion.

Further, soldering with a conventional solder product tends to lack the flow of solder, so that the amount of solder used may increase. This will, for example, cause increased $CO_2$ emissions, which is likely to have a great environmental load.

Additionally, solids, such as oxides including metal oxides, may mix into a molten metal during manufacture of a tin article. This may pose some drawbacks when producing the tin article, such as causing bending difficulty during a bending process and an increased likelihood of occurrence of cutting lines, or cutting marks, during a cutting process. This may spoil the aesthetics of the tin article. Mixing of solids may also cause bending difficulty and an increased likelihood of occurrence of cracks.

The present invention aims to provide a method for manufacturing a solder product that is suitable for finer soldering. The present invention also aims to provide a method for manufacturing a solder product that provides greater flowability of solder during soldering.

The present invention also aims to perform finer soldering at high quality.

The present invention also aims to provide a soldered component that is less likely to experience failures in which the component is joined in an inclined fashion.

The present invention also aims to provide a solder product that provides greater flowability of solder during soldering.

The present invention also aims to provide a printed wiring board that provides increased adhesion between a printed board and electronic components at joining portions and thus provides increased joining strength.

The present invention also aims to provide a printed circuit board that eliminates the need for nickel plating and gold plating.

The present invention also aims to provide a conductive member, a wire, and a soldered product that are less susceptible to changes over time.

The present invention also aims to provide a flexible printed board that eliminates the need for plating terminals with gold leaf.

The prevent invention also aims to provide an electronic component that is less likely to float and experience cracks.

The prevent invention also aims to provide methods for manufacturing a tin article and a tin intermediate product that are less likely to experience mixing therein of solids such as oxides, are less likely to spoil the aesthetics of the tin article, are easy to bend, and are less susceptible to cracks.

The present invention also aims to provide a tin article with good aesthetics.

The present invention also aims to provide a tin intermediate product that is easy to bend and is less susceptible to cracks.

Solution to Problem

A method for manufacturing a solder product in accordance with an aspect of the present invention includes: a heating step of heating and melting a raw material to obtain a molten metal, the raw material containing tin as a main component and a metal element other than lead as a secondary component; a filtration step of filtering the molten metal with a filter having an aperture size of not more than 10 µm; and a cooling step of cooling and solidifying the filtered molten metal.

In the above method, in the filtration step, the filter may be heated.

In the filtration step, wire mesh made of stainless steel may be used as the filter.

In the heating step, the raw material may contain copper as the metal element serving as the secondary component.

A method for manufacturing a solder product in accordance with another aspect of the present invention includes: a heating step of heating and melting a raw material to obtain a molten metal, the raw material containing tin as a main component and a metal element other than lead as a secondary component; a removing step of removing, from the molten metal set to a temperature from 230° C. to 260° C., solids having a diameter of more than 10 µm and present within the molten metal; and a cooling step of cooling and solidifying the molten metal with the solids removed therefrom.

In the above method, in the removing step, the molten metal may be set to a temperature from 235° C. to 250° C.

In the removing step, the solids having a diameter of more than 5 µm may be removed from the molten metal.

A solder in one embodiment of the present invention is made of an alloy of a mixture of a plurality of metal elements, wherein solids with a grain size of more than 5 µm derived from the alloy that remain in a molten metal of the alloy when the alloy is melted account for not more than 0.03 wt. % of the alloy before melting.

A soldered component in one embodiment of the present invention is joined by the above solder.

A method for manufacturing a solder in one embodiment of the present invention includes: a step of melting an alloy of a mixture of a plurality of metal elements to obtain a molten metal; a step of removing, from the molten metal, solids with a grain size of more than 10 µm derived from the alloy; and a step of manufacturing a solder by solidifying the molten metal with the solids removed therefrom.

A solder product according to an aspect of the present invention includes: tin as a main component and a metal element other than lead as a secondary component; and a carboxylic acid having 10 to 20 carbons, the carboxylic acid being mainly distributed over a surface of the solder product to form a surface layer.

The carboxylic acid may be a fatty acid having 12 to 16 carbons.

The carboxylic acid may be a palmitic acid.

The solder product may contain copper as the secondary component.

A method for manufacturing a solder product according to an aspect of the present invention includes: a heating step of heating and melting a raw material to obtain a molten metal, the raw material containing tin as a main component, a metal element other than lead as a secondary component, and a carboxylic acid having 10 to 20 carbons; and a cooling step of cooling and solidifying the molten metal and depositing the carboxylic acid at a surface of the solder product.

The above method may preferably further include a filtration step of filtering the molten metal with a filter having an aperture size of not more than 10 µm.

A printed wiring board according to an aspect of the present invention includes: a substrate; and an electronic component soldered onto the substrate by a solder, wherein the solder contains tin as a main component, a metal element other than lead as a secondary component, and a carboxylic acid having 10 to 20 carbons, the carboxylic acid being mainly distributed over a surface of the solder to form a surface layer.

A printed circuit board according to an aspect of the present invention includes: a substrate; a wiring pattern layer formed in a thin-film shape on the substrate, the wiring pattern layer constituting a wiring pattern; and a solder layer formed in a thin-film shape on the wiring pattern layer, the solder layer containing a solder, wherein the solder in the solder layer contains tin as a main component, a metal element other than lead as a secondary component, and a carboxylic acid having 10 to 20 carbons, the carboxylic acid being mainly distributed over a surface of the solder to form a surface layer.

The printed circuit board may further include an electronic component joined to the solder layer.

The electronic component may be joined to the solder layer by soldering, and a solder used for the soldering may contain tin as a main component, a metal element other than lead as a secondary component, and a carboxylic acid having 10 to 20 carbons, the carboxylic acid being mainly distributed over a surface of the solder to form a surface layer.

The wiring pattern layer may contain copper.

A wire according to an aspect of the present invention contains, in at least a portion thereof, the above solder product.

A linear conductor may be coated with the above solder product.

A soldered product according to an aspect of the present invention includes connecting members that are soldered to each other via the above solder product.

A flexible printed board according to an aspect of the present invention includes a terminal, wherein a surface of the terminal is covered with the above solder product.

An electronic component according to an aspect of the present invention includes a terminal, wherein a surface of the terminal is covered with the above solder product.

A method for manufacturing a tin article according to an aspect of the present invention includes: a heating step of heating and melting a raw material to obtain a molten metal, the raw material containing tin as a main component; a filtration step of filtering the molten metal with a filter having an aperture size of not more than 10 µm; a cooling step of cooling and solidifying the molten metal; and a forming step of shaping the molten metal into a tin article.

The raw material may further contain a metal element other than lead and cadmium as a secondary component, in addition to tin as the main component.

The secondary component may include at least one of silver, copper, antimony, and bismuth.

The above method may further include a coloring step after the forming step, the coloring step forming a colored layer at a surface of the tin article to color the tin article.

The colored layer may include gold leaf.

The tin article may be a piece of tableware.

The raw material may further contain a carboxylic acid having 10 to 20 carbons.

The carboxylic acid may be a palmitic acid.

A method for manufacturing a tin article according to another aspect of the present invention includes: a heating step of heating and melting a raw material to obtain a molten metal, the raw material containing tin as a main component and a carboxylic acid having 10 to 20 carbons; a cooling step of cooling and solidifying the molten metal and depositing the carboxylic acid at a surface of the molten metal; and a forming step of shaping the molten metal into a tin article.

The carboxylic acid may be a fatty acid having 12 to 16 carbons.

The carboxylic acid may be a palmitic acid.

A method for manufacturing a tin intermediate product according to an aspect of the present invention includes: a heating step of heating and melting a raw material to obtain a molten metal, the raw material containing tin as a main component; a filtration step of filtering the molten metal with a filter having an aperture size of not more than 10 µm; and a cooling step of cooling and solidifying the molten metal.

A method for manufacturing a tin intermediate product according to another aspect of the present invention includes: a heating step of heating and melting a raw material to obtain a molten metal, the raw material containing tin as a main component and a carboxylic acid having 10 to 20 carbons; and a cooling step of cooling and solidifying the molten metal and depositing the carboxylic acid at a surface of the molten metal.

A tin article according to an aspect of the present invention includes: tin as a main component; and a carboxylic acid having 10 to 20 carbons, the carboxylic acid being mainly distributed over a surface of the tin article to form a surface layer.

The tin article may further include a colored layer at a surface of the tin article to color the tin article.

The tin article may further include a metal element other than lead and cadmium as a secondary component, in addition to tin as the main component.

A tin intermediate product according to an aspect of the present invention includes: tin as a main component; and a carboxylic acid having 10 to 20 carbons, the carboxylic acid being mainly distributed over a surface of the tin intermediate product to form a surface layer.

A conductive member according to an aspect of the present invention includes: tin as a main component; and a carboxylic acid having 10 to 20 carbons, the carboxylic acid being mainly distributed over a surface of the conductive member to form a surface layer.

A wire according to an aspect of the present invention includes: a linear conductor; and a covering layer covering the linear conductor, the covering layer containing tin as a main component and a carboxylic acid having 10 to 20 carbons, the carboxylic acid being mainly distributed over a surface of the covering layer to form a surface layer.

A flexible printed board according to another aspect of the present invention includes a terminal, wherein a surface of the terminal is covered with a coating including tin as a main component and a carboxylic acid having 10 to 20 carbons, the carboxylic acid being mainly distributed over a surface of the coating to form a surface layer.

An electronic component according to another aspect of the present invention includes a terminal, wherein a surface of the terminal is covered with a coating including tin as a main component and a carboxylic acid having 10 to 20 carbons, the carboxylic acid being mainly distributed over a surface of the coating to form a surface layer.

Advantageous Effects of Invention

The present invention can provide a method for manufacturing a solder product that is suitable for finer soldering. The present invention can also provide a method for manufacturing a solder product that provides greater flowability of solder during soldering.

The present invention can also perform finer soldering at high quality.

The present invention can also provide a soldered component that is less likely to experience failures in which the component is joined in an inclined fashion.

The present invention can also provide a solder product that provides greater flowability of solder during soldering.

The present invention can also provide a printed wiring board that provides increased adhesion between a printed board and electronic components at joining portions and thus provides increased joining strength.

The present invention can also provide a printed circuit board that eliminates the need for nickel plating and gold plating.

The present invention can also provide a conductive member, a wire, and a soldered product that are less susceptible to changes over time.

The present invention can also provide a flexible printed board that eliminates the need for plating terminals with gold leaf.

The present invention can also provide an electronic component that is less likely to float and experience cracks.

The present invention can also provide methods for manufacturing a tin article and a tin intermediate product that are less likely to experience mixing therein of solids such as oxides, are less likely to spoil the aesthetics of the tin article, are easy to bend, and are less susceptible to cracks.

The present invention can also provide a tin article with good aesthetics.

The present invention can also provide a tin intermediate product that is easy to bend and is less susceptible to cracks.

BRIEF DESCRIPTION OF DRAWINGS

FIGS. 1A and 1B illustrate a solder product of an exemplary embodiment.

FIGS. 15A and 15B illustrate a tin article containing a carboxylic acid having 10 to 20 carbons.

FIGS. 16A to 16C explain a configuration of an evaluation substrate used for solder bridge evaluation.

DESCRIPTION OF EMBODIMENTS

Figure 2A:
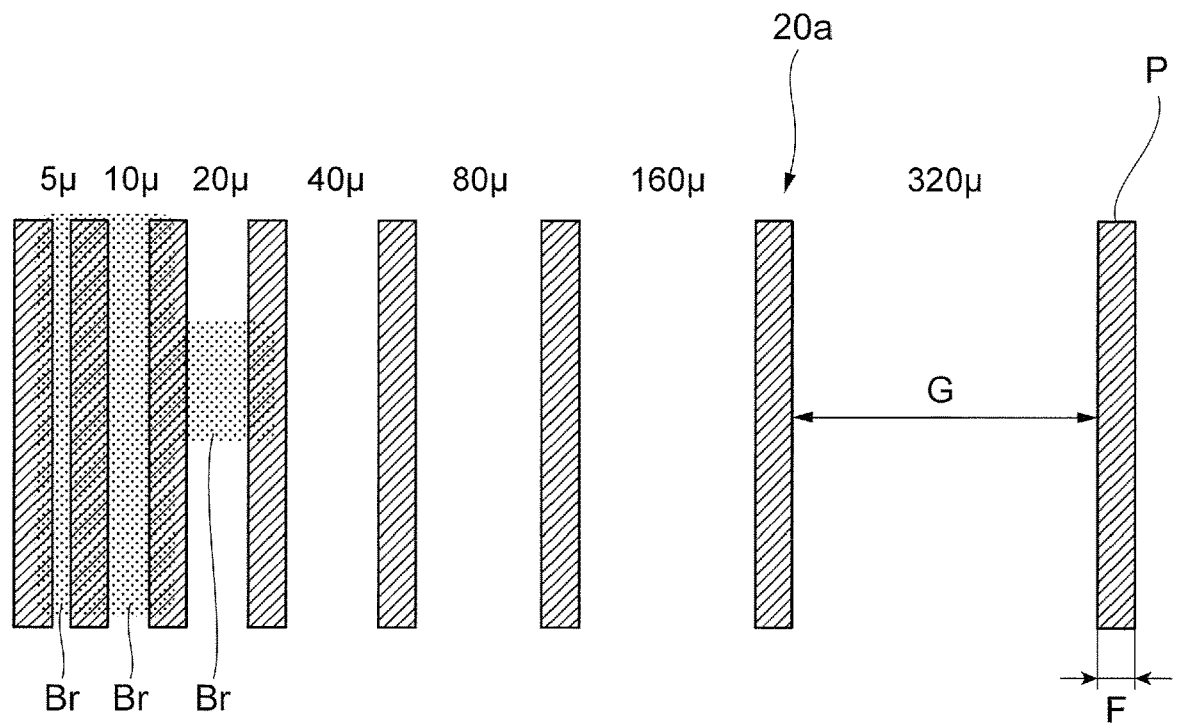
FIG. 2A illustrates a first example state of a conventional solder.

An exemplary embodiment of the present invention will be described in detail below with reference to the attached drawings. Dimensions, including the size and thickness, of components in the drawings as referred to in the following description may differ from actual ones.

Definitions

Definitions of some terms used in the present embodiment will be first introduced.

(Lead-Free Solder)

A "lead-free solder" as referred to in the present embodiment is a mixture of multiple metal elements including tin (Sn) as a main component and one or more metal elements other than lead (Pb) as secondary components.

Metal elements for secondary components may be any component other than lead, and examples may include copper (Cu), silver (Ag), bismuth (Bi), and zinc (Zn). Among these, copper is preferable as it is inexpensively available.

Two or more kinds of metal elements (e.g., silver and copper) may be used as the secondary components, as well as a single kind of metal element.

The lead-free solder in the present embodiment may, despite its name, actually contain lead as an unavoidable impurity.

(Solder Product)

A "solder product" as referred to in the present embodiment is a product made of the above lead-free solder used for soldering to join a target metal material.

The solder product may assume a planar or rod-like shape (e.g., ingot, plate, or rod), a linear shape (e.g., wire), or a spherical shape (e.g., ball). The solder product may contain flux. Thus, for example, the solder product includes a paste-type cream solder produced by mixing fine solder powers with flux and a thread-like thread solder containing a flux core.

(Solder Raw Material)

A "solder raw material" as referred to in the present embodiment is a raw material used for manufacturing the above solder product.

The solder raw material may include the above metal elements constituting the main component or the secondary components or an alloy of these elements. The solder raw material may also include a carboxylic acid having 10 to 20 carbons described above. In the present embodiment, the solder raw material may also include solder fragments generated as a result of soldering using the above solder product. Various metal oxides or various impurities can mix in the solder raw material (in particular, solder fragments).

(Solder)

A "solder" as referred to in the present embodiment is a part of the above solder product that has migrated and adhered to metal materials to be joined as a result of the joining by soldering. In the present embodiment, the term "solder" is used to refer to a metal mixture after soldering to distinguish from the term "solder product", which is a metal mixture before soldering. However, the actual "solder" means an alloy for joining objects, regardless of whether it is before or after soldering.

(Wire)

A "wire" as referred to in the present embodiment is an electric wire that contains the above solder product in at least a portion thereof. The wire may entirely consist of the above solder product, or may use the above solder product as part of it. Examples of the wire using the solder product as part of it may include an electric wire having a linear conductor covered with the above solder product. The linear conductor is, for example, a copper wire. Thus, in this case, the wire has an outer surface of the copper wire coated with the above solder product. The wire may further include an insulating coating that covers an outer surface of the solder product covering the wire. The insulating coating is made of resin or the like, for example. This means that the wire may be an insulated electric wire.

(Soldered Product)

A "soldered product" as referred to in the present embodiment is a product that includes connecting members soldered to each other via the above solder product. The connecting members refer to multiple members to be joined by soldering, and are not limited to particular components so long as they can be soldered. Examples of the connecting members include a metal member and a ceramic member (e.g., ceramics and glass). Examples of products in which the connecting members are soldered together include a printed board, electric products using the printed board, accessories (such as pendants and brooches), stained glass, and boxes formed by soldering metal plates together.

(Relationship Between Lead-Free Solder, Solder Product, Solder Raw Material, and Solder)

Hence, in the present embodiment, the solder raw material is used to manufacture the solder product composed of the lead-free solder, and the solder product is used to solder target metal materials, so that the solder migrates and adheres to the metal materials. The product manufactured through soldering with the solder product is the soldered product.

(Flexible Printed Board)

A "flexible printed board" (or flexible printed circuits (FPC)) as referred to in the present embodiment is a printed board that is flexible. For example, the flexible printed board assumes a thin-film shape and has a structure in which an adhesive layer is formed on an insulator base film and conductor foil is bonded onto the adhesive layer. The flexible printed board includes terminals for connection with connectors or the like. The terminals may also be called electrodes. The terminals typically and conventionally have their conductive foil covered with gold leaf or the like. In contrast, the terminals of the flexible printed board of the present embodiment have their conductive foil surfaces covered with the above solder product. The conductive foil is, for example, copper foil made of copper. Thus, in this case, the terminals of the flexible printed board have their copper foil surfaces coated with the above solder product. Conventionally, a portion to be plated needs cleaning beforehand to be plated with gold leaf, and a cleaning agent used for cleaning may remain after cleaning. This residual cleaning agent may cause failures such as contact failures, cracks, and deterioration of joints. The present embodiment can cover the terminals with the solder product without the need for cleaning the terminals beforehand. Thus, no cleaning agent will remain. Hence, the above failures are less likely occur and, moreover, reduction of $CO_2$ emissions can be expected. Additionally, soldering with the solder product of the present embodiment allows patterns to be formed with narrow gaps, as will be detailed later. This means that gaps between the multiple terminals of the flexible printed board can be made narrower as well.

(Electronic Component)

An "electronic component" as referred to in the present embodiment is a component that is a part of an electronic circuit and includes terminals for electrical connection with a board or other electronic components. The electronic component is not limited to a particular component, and examples may include capacitors, resistors, sensors, semiconductors, integrated circuits, connectors, and micro LED panels. The terminals may also be called electrodes. The terminals have their surfaces covered with the above solder product. The conductive wire is a copper wire made of copper. Thus, in this case, the terminals of the electronic component are coated with the above solder product on the copper wire surfaces. Additionally, as will be detailed later, the solder made by using the solder product of the present embodiment can reduce floating of components and reduce cracks. The present embodiment can also improve the flowability and wettability characteristics and realize uniform solder application. Hence, covering the terminals of the electronic component with the solder product of the present invention is likewise advantageous in order to reduce floating of components and cracks, improve the flowability and wettability characteristics, and realize uniform solder application.

(Molten Metal)

"Molten metal" as referred to in the present embodiment is metal obtained by heating and melting the solder raw material, which is the raw material of the solder product.

(Solder Melt)

"Solder melt" as referred to in the present embodiment is a solder obtained by heating and melting the solder product, which is the raw material of the solder.

[Solder Product]

The solder product in the present embodiment will now be described.

FIGS. 1A and 1B illustrate the solder product of the present embodiment.

FIG. 1A illustrates the solder product 20, and FIG. 1B illustrates an enlarged cross-section of a surface portion of the solder product 20 shown in FIG. 1A.

As shown in FIG. 1B, the solder product 20 of the present embodiment includes a lead-free solder part 21 and a surface layer 22.

The lead-free solder part 21 mainly consists of the lead-free solder described above. That is, the lead-free solder part 21 includes tin (Sn) as a main component and one or more metal elements other than lead (Pb) as secondary components. Additionally, the lead-free solder part 21 of the present embodiment contains less amount of solids (such as oxides) and acicular crystals than conventional solder parts.

The surface layer 22 mainly consists of the carboxylic acid described above. In other words, the carboxylic acid is mainly distributed over the surface of the solder product 20 to form the surface layer 22. The surface layer 22 covers the entire surface of the solder product 20. For example, the carboxylic acid is more localized at the surface of the solder product 20 to thereby form the surface layer 22.

In that way, the surface layer 22 serves as a protective layer for the lead-free solder part 21. That is, the surface layer 22 prevents oxygen and moisture in the air from reaching the lead-free solder part 21. The surface layer 22 can be thus regarded as an oxidation-resistant film or a water-resistant film. Hence, in the case where the solder product 20 is a cream solder for example, it can be stored at room temperature. Cream solders are typically and conventionally stored at a low temperature using a refrigerator or the like because they are susceptible to oxidation and moisture absorption. In contrast, the cream solder of the present embodiment is less susceptible to oxidation and moisture absorption because the surface layer 22 is present in solder powders contained therein. The cream solder of the present embodiment can be thus stored at room temperature. The cream solder of the present embodiment also has a longer shelf life and is less likely to be wasted. As such, it is environmentally friendly and reduction of $CO_2$ emissions can be expected therefrom.

As described above, the carboxylic acid has 10 to 20 carbons. With less than 10 carbons, the carboxylic acid is less likely to form the surface layer 22. With more than 20 carbons, the carboxylic acid is less likely to be dispersed in the molten metal; in this case too, the carboxylic acid is less likely to form the surface layer 22.

The carboxylic acid is more preferably a fatty acid having 12 to 16 carbons. In particular, a monovalent fatty acid having 12 to 16 carbons is still more preferable. In particular, a monovalent saturated fatty acid having 12 to 16 carbons is yet more preferable.

Examples of monovalent saturated fatty acids include a lauric acid having 12 carbons ($CH_3$—$(CH_2)_{10}$—COOH), a myristic acid having 14 carbons ($CH_3$—$(CH_2)_{12}$—COOH), a pentadecylic acid having 15 carbons ($CH_3$—$(CH_2)_{13}$—COOH), and a palmitic acid having 16 carbons ($CH_3$—$(CH_2)_{14}$—COOH).

Among monovalent fatty acids, the palmitic acid having 16 carbons is particularly preferable. The palmitic acid has a melting point of 62.9° C. and a boiling point of 351° C. to 352° C. The palmitic acid is in a molten liquid phase in a soldering temperature range of 200° C. to 300° C., and is likely to adhere to the surface after the solder solidifies. In that sense, the palmitic acid can be said to have good compatibility with the lead-free solder. The use of the palmitic acid can also improve the flowability of solder during soldering. A fatty acid with more than or less than 16 carbons may not assume a molten liquid phase in the soldering temperature range. Also, the flowability of solder during soldering is likely to decrease when a fatty acid having more than or less than 16 carbons is used, as compared to when the palmitic acid is used.

For example, the palmitic acid is contained in coconut oil and coconut oil waste and can be extracted from these. In that sense, the palmitic acid can be said to be a plant material and a renewable raw material. Also, the palmitic acid has less impact on human skin and thus offers excellent safety. It should be noted that the palmitic acid may be extracted from other materials than the coconut oil or the like, or may be prepared by chemical synthesis.

Monovalent fatty acids that are not monovalent saturated fatty acids may include monovalent unsaturated fatty acids, such as an oleic acid ($CH_3$—$(CH_2)_7$—CH=CH—$(CH_2)_7$—COOH), a linoleic acid ($CH_3$—$(CH_2)_4$—CH=CH—$CH_2$—CH=CH—$(CH_2)_7$—COOH), and a linolenic acid ($CH_3$—$CH_2$—CH=CH—$CH_2$—CH=CH—$CH_2$—CH=CH—$(CH_2)_7$—COOH) each having 18 carbons.

Fatty acids that are not monovalent fatty acids may include divalent fatty acids, which are dicarboxylic acids. Examples include a sebacic acid having 10 carbons (HOOC—$(CH_2)_8$—COOH) and a tridecanedioic acid having 13 carbons (HOOC—$(CH_2)_{11}$—COOH).

Examples of carboxylic acids having 10 to 20 carbons, rather than 12 to 16 carbons, include a sebacic acid having 10 carbons (HOOC—$(CH_2)_8$—COOH), a stearic acid having 18 carbons ($CH_3$—$(CH_2)_{16}$—COOH), and an arachidic acid having 20 carbons ($CH_3$—$(CH_2)_{18}$—COOH).

The surface layer 22 may have a thickness of 1 nm to 1 μm, for example. The surface layer 22 is a monolayer of the carboxylic acid, for example. In the case where the surface layer 22 is a monolayer of the carboxylic acid, the surface layer 22 has a thickness of 1 nm to 4 nm, for example. However, the surface layer 22 is not necessarily a monolayer and may, as a result, have a greater thickness. In the case where the surface layer 22 is a monolayer of the palmitic acid, the surface layer 22 has a thickness of about 2.5 nm.

[Solder]

The solder in the present embodiment will now be described. The following description discusses a printed board on which the solder of the present embodiment is used.

A conventional solder as discussed below is a lead-free solder composed of 0.7 wt. % of copper with the balance of tin. The solder of the present embodiment is a lead-free solder containing the above carboxylic acid in addition to these components.

Figure 2B:
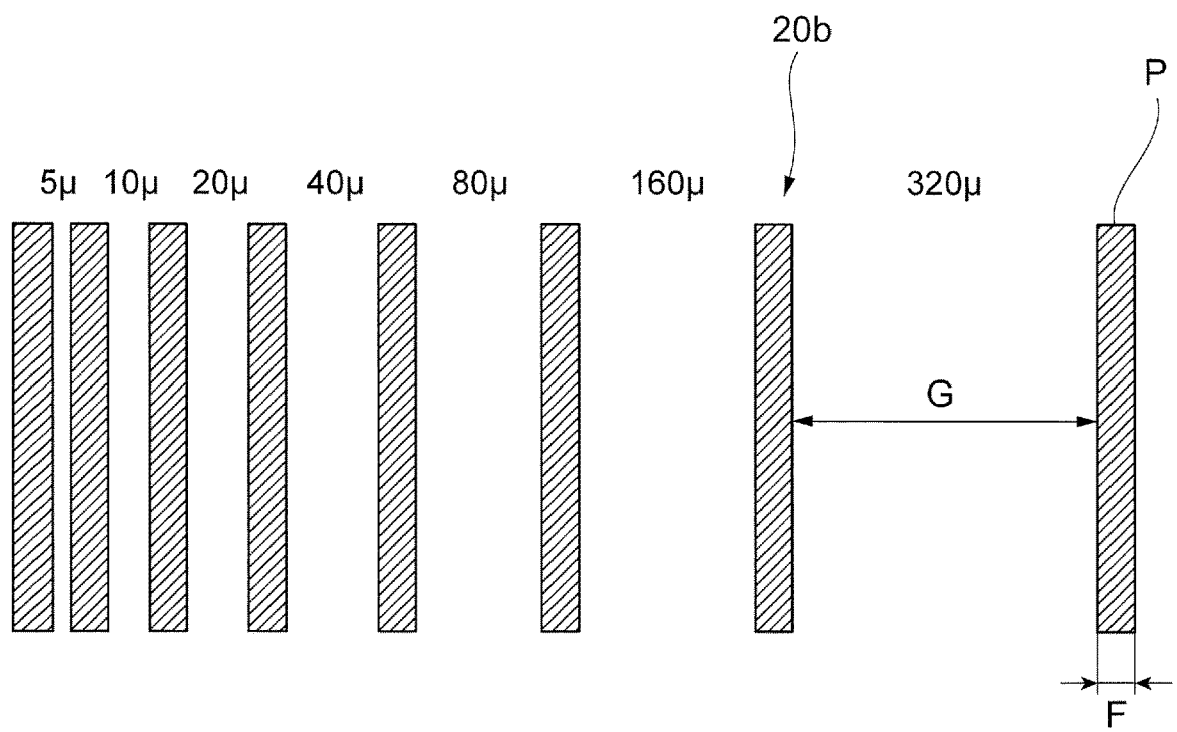
FIG. 2B illustrates a first example state of a solder of the present embodiment.

FIG. 2A illustrates a first example state of the conventional solder. FIG. 2B illustrates a first example state of the solder of the present embodiment.

The figures each show the case where multiple patterns P having a predetermined electrode width F are formed at predetermined gaps G by the solder on a printed wiring board. In this case, the electrode width F is 10 μm. The predetermined gaps G are 5 μm, 10 μm, 20 μm, 40 μm, 80 μm, 160 μm, and 320 μm. FIG. 2A shows the patterns P formed by the conventional solder 20a, while FIG. 2B shows the patterns P formed by the solder 20b made by using the solder product 20 of the present embodiment.

Comparing FIGS. 2A and 2B, the solder 20a in FIG. 2A causes a short circuit between adjacent patterns P with the gap G of not more than 20 μm in-between. In other words, a so-called solder bridge Br occurs. In contrast, the solder 20b in FIG. 2B allows all patterns P to be formed. This means that, with the use of the solder 20b, for example, electrodes of an electronic component can be soldered without being short-circuited even when they have narrow gaps in-between. This is due to the fact that, whereas the conventional solder 20a contains solids (such as oxides) and acicular crystals, the solder 20b of the present embodiment contains smaller amounts of these solids and acicular crystals. That is, with the conventional solder 20a, which contains larger amounts of the solids and acicular crystals, it is difficult to form the patterns P with narrow gaps G in-between. In contrast, with the solder 20a of the present embodiment, which contains smaller amounts of the solids and acicular crystals, it is easy to form the patterns P with narrow gaps G in-between.

As another advantageous feature of the solder product 20 of the present embodiment, the solder made by using the solder product 20 has better flowability and better wettability to printed wire than conventional solders. Thus, it is less likely that the solder bulges out from the patterns P.

Figure 3A:
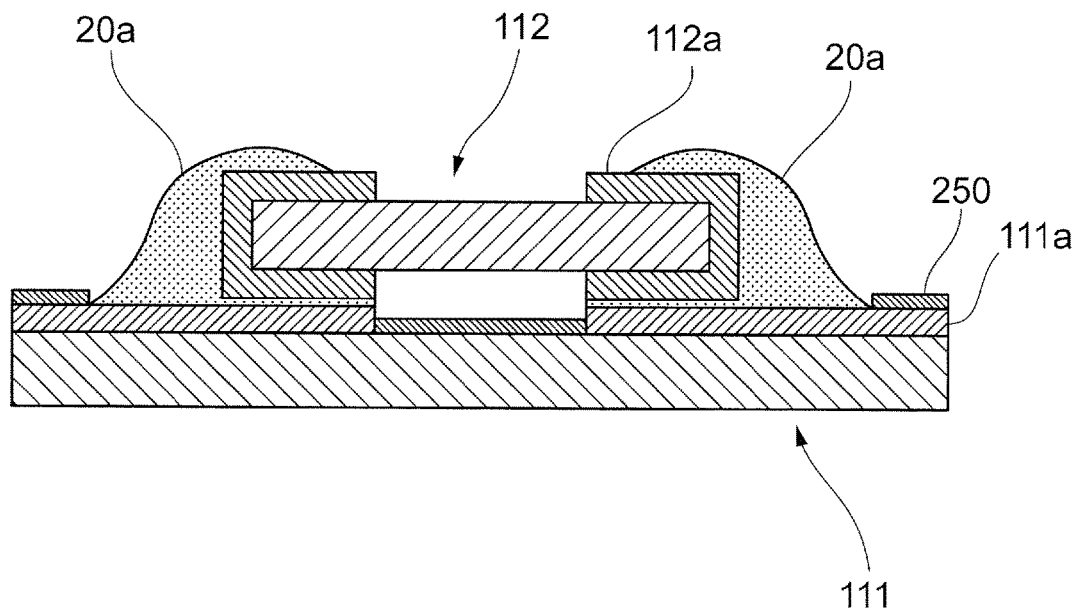
FIG. 3A illustrates a second example state of the conventional solder.
Figure 3B:
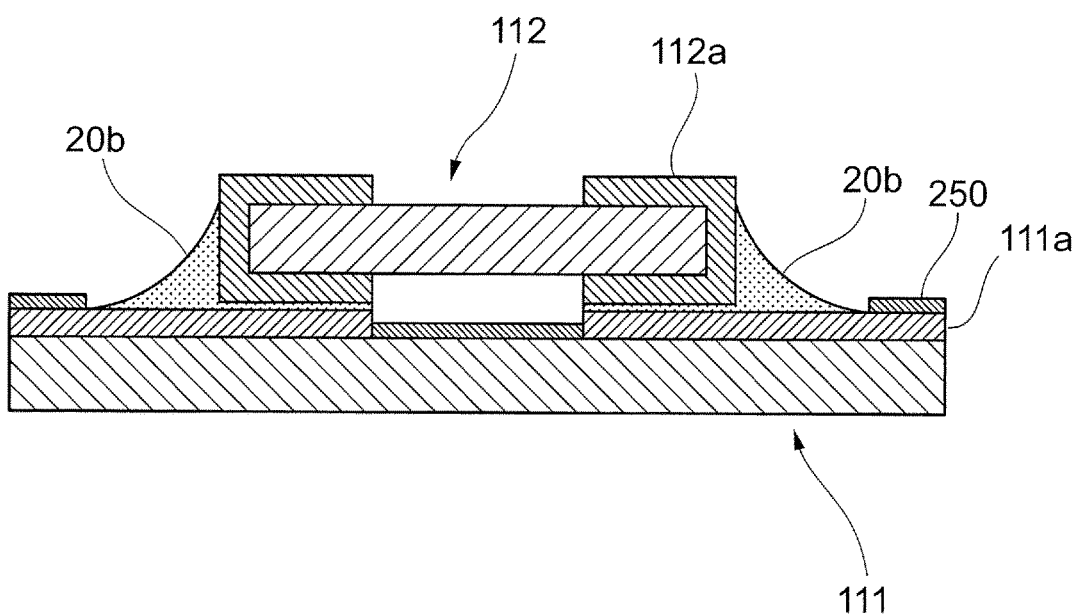
FIG. 3B illustrates a second example state of the solder of the present embodiment.

FIG. 3A illustrates a second example state of the conventional solder. FIG. 3B illustrates a second example state of the solder of the present embodiment.

The figures each show the case where electrodes 112a of an electronic component 112 are soldered onto pads 111a of a substrate 111. FIG. 3A shows soldering with the conventional solder 20a, while FIG. 3B shows soldering with the solder 20b made by using the solder product 20 of the present embodiment. It should be noted that a solder resist 250 is formed to prevent adhesion of the solders 20a, 20b. The solders 20a, 20b adhere to portions other than the solder resist 250. The function of the solder resist 250 is the same in the other examples described below.

Similarly to the case of FIGS. 2A and 2B, the solder product 20 of the present embodiment provides better flowability and better wettability to the pads 111a and the electrodes 112a than conventional solders. Thus, comparing FIGS. 3A and 3B, the conventional solder 20a of FIG. 3A has poor flowability and poor wettability to the pads 111a and the electrodes 112a, so that an application amount of the solder 20a needs to be increased to join them. In contrast, the solder 20b of FIG. 3B has good flowability and good wettability to the pads 111a and the electrodes 112a, so that only a smaller application amount of the solder 20b is required to join them. This can reduce a usage amount of the solder 20a for soldering. Thus, reduction of $CO_2$ emissions can also be expected.

Figure 4A:
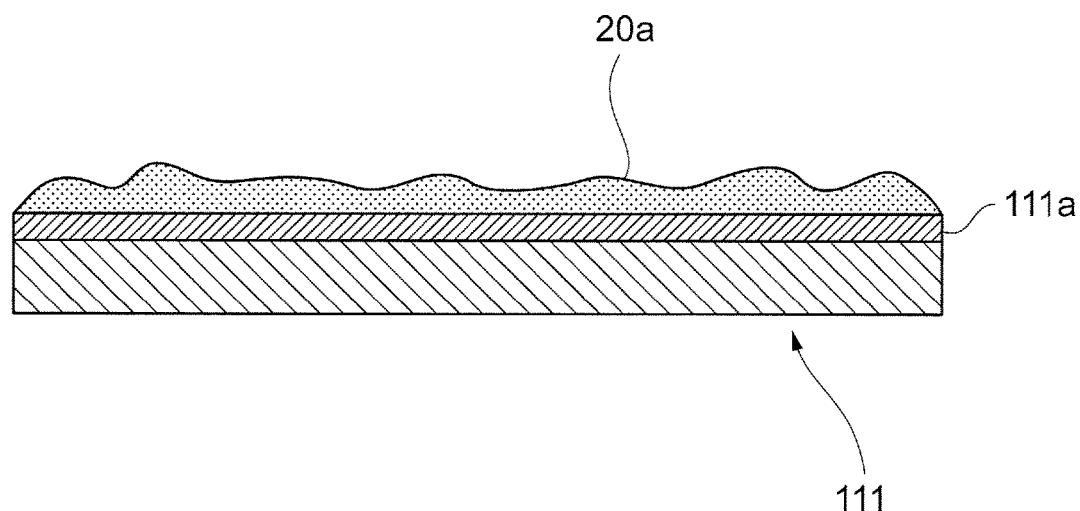
FIG. 4A illustrates a third example state of the conventional solder.
Figure 4B:
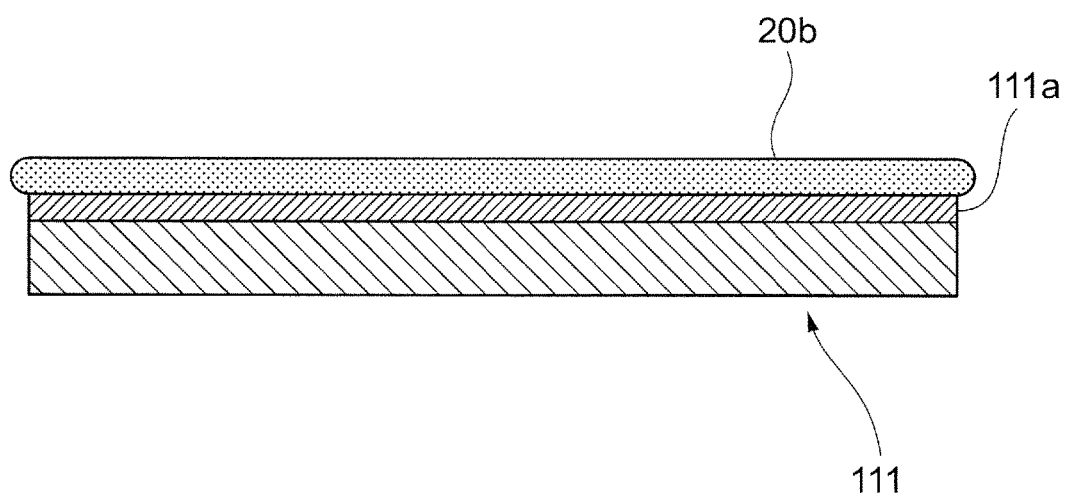
FIG. 4B illustrates a third example state of the solder of the present embodiment.

FIG. 4A illustrates a third example state of the conventional solder. FIG. 4B illustrates a third example state of the solder of the present embodiment.

The figures each show the case where the pad 111a of the substrate 111 is coated with the solder. Comparing FIGS. 4A and 4B, FIG. 4A shows the coating with the conventional solder 20a, while FIG. 4B shows the coating with the solder 20b made by using the solder product 20 of the present embodiment.

Comparing FIGS. 4A and 4B, the solder 20b of FIG. 4B provides a smoother surface than the solder 20a of FIG. 4A. This is due to the fact that the solder 20b has better flowability and better wettability to the pad 111a than the solder 20a and contains smaller amounts of solids (such as oxides) and acicular crystals than the solder 20a.

Figure 5A:
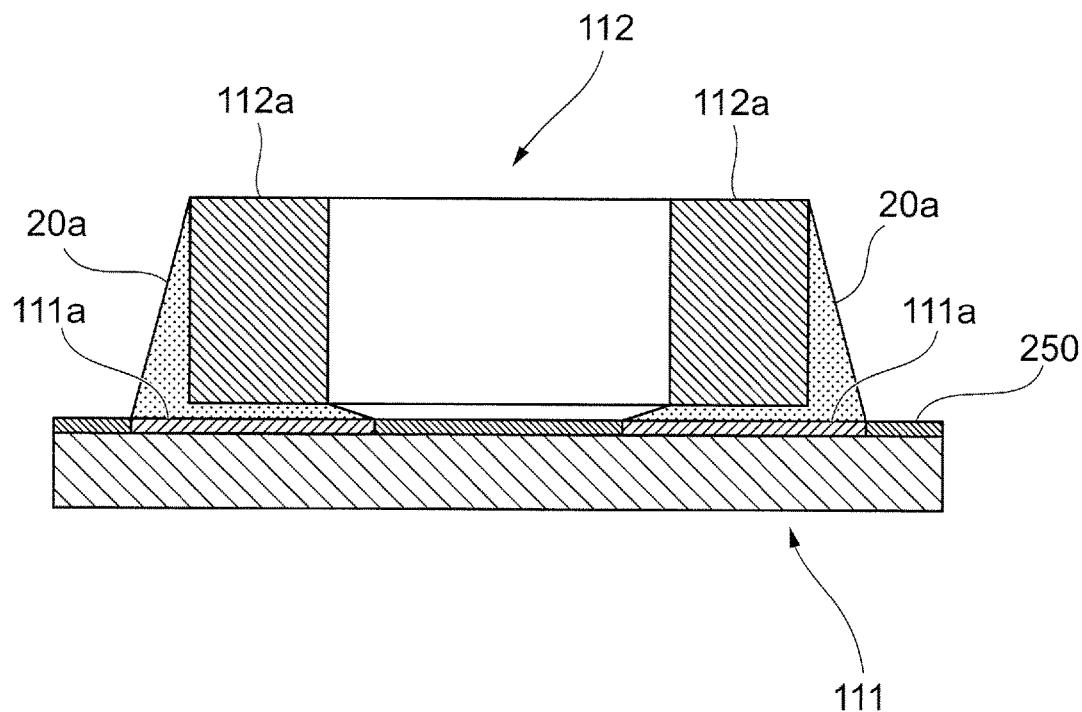
FIG. 5A illustrates a fourth example state of the conventional solder.
Figure 5B:
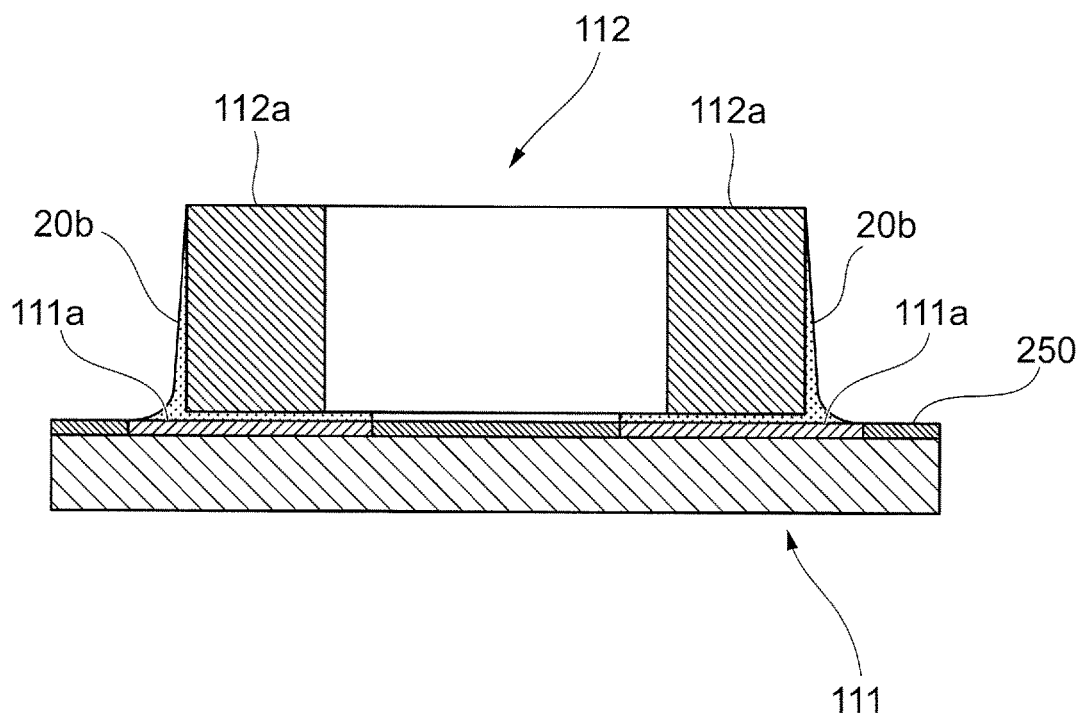
FIG. 5B illustrates a fourth example state of the solder of the present embodiment.

FIG. 5A illustrates a fourth example state of the conventional solder. FIG. 5B illustrates a fourth example state of the solder of the present embodiment.

The figures each show the case where the electrodes 112a of the electronic component 112 are soldered onto the pads 111a of the substrate 111, and the pads 111a and the electrodes 112a are coated with the solder. FIG. 5A shows soldering with the conventional solder 20a, while FIG. 5B shows soldering with the solder 20b made by using the solder product 20 of the present embodiment.

Comparing FIGS. 5A and 5B, since the solder 20a of FIG. 5A has poor flowability and poor wettability to the pads 111a and the electrodes 112a, a large application amount of the solder 20a is required to join and coat them. In contrast, the solder 20b of FIG. 5B has good flowability and good wettability to the pads 111a and the electrodes 112a, so that they can be soldered and coated even with a small application amount of the solder 20b.

Figure 6A:
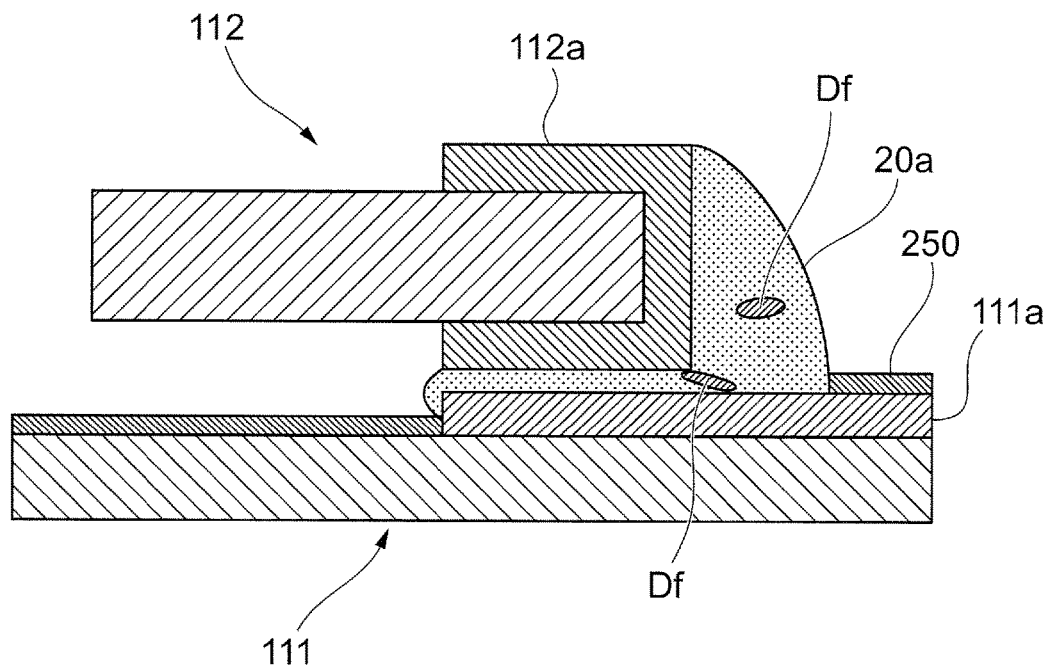
FIG. 6A illustrates a fifth example state of the conventional solder.
Figure 6B:
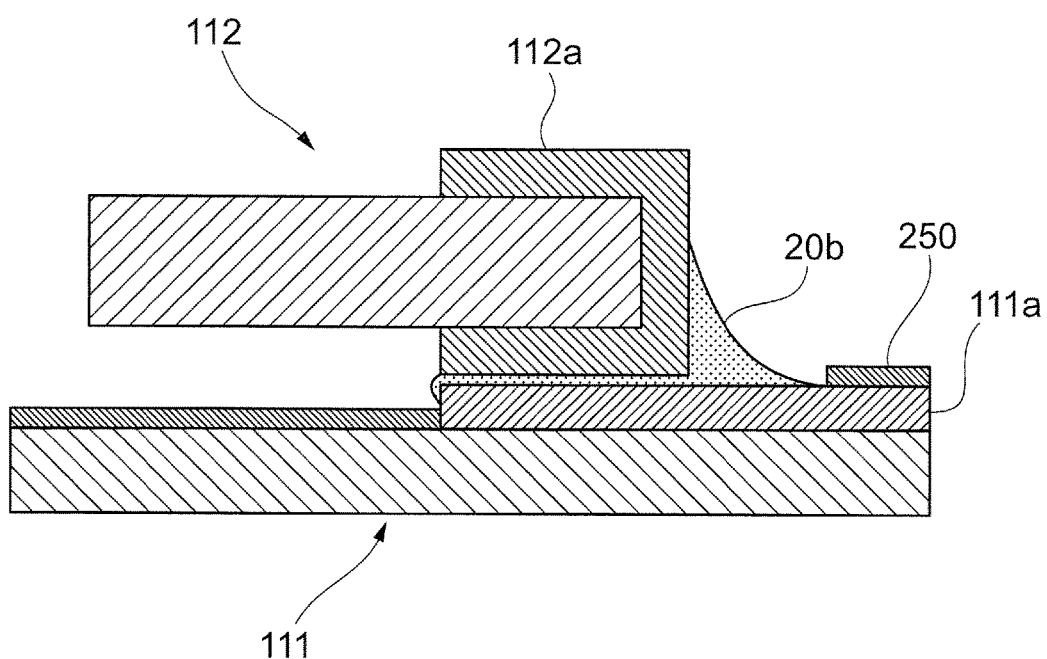
FIG. 6B illustrates a fifth example state of the solder of the present embodiment.

FIG. 6A illustrates a fifth example state of the conventional solder. FIG. 6B illustrates a fifth example state of the solder of the present embodiment.

The figures each show the case where the electrode 112a of the electronic component 112 is soldered onto the pad 111a of the substrate 111. FIG. 6A shows soldering with the conventional solder 20a, while FIG. 3B shows soldering with the solder 20b made by using the solder product 20 of the present embodiment.

Comparing FIGS. 6A and 6B, the solder 20a is more likely to contain solids (such as oxides), acicular crystals, and voids Df because of its larger amount. In contrast, the solder 20b of FIG. 6B is less likely to contain solids (such as oxides), acicular crystals, and voids Df because of its smaller amount than the solder 20a shown in FIG. 6A.

Additionally, the solder 20b provides a greater joining strength than the solder 20a since the solder 20b is less likely to contain solids (such as oxides), acicular crystals, and voids Df.

Figure 7A:
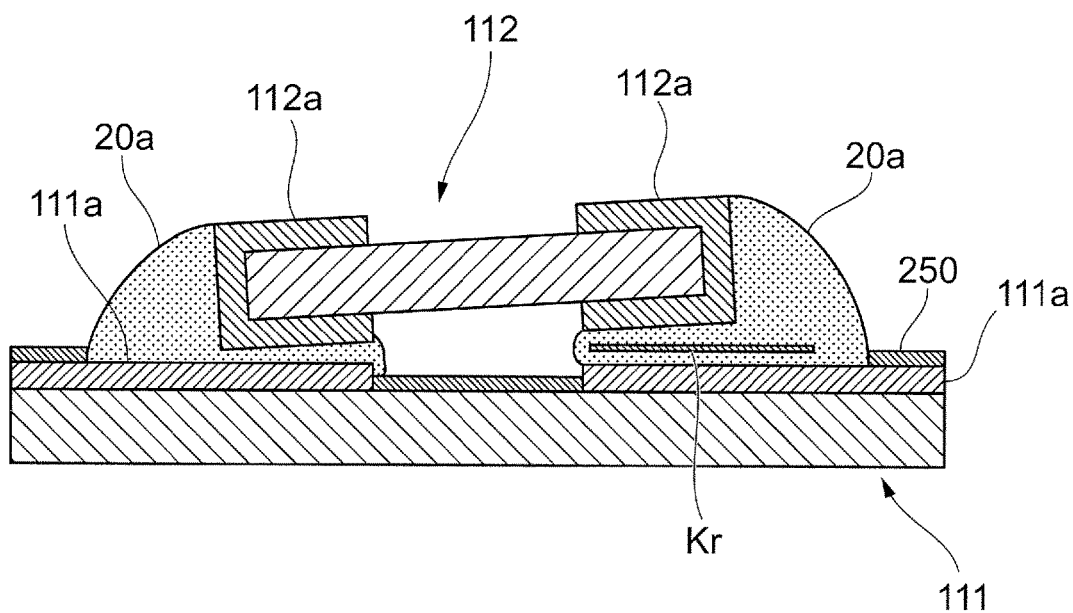
FIG. 7A illustrates a sixth example state of the conventional solder.
Figure 7B:
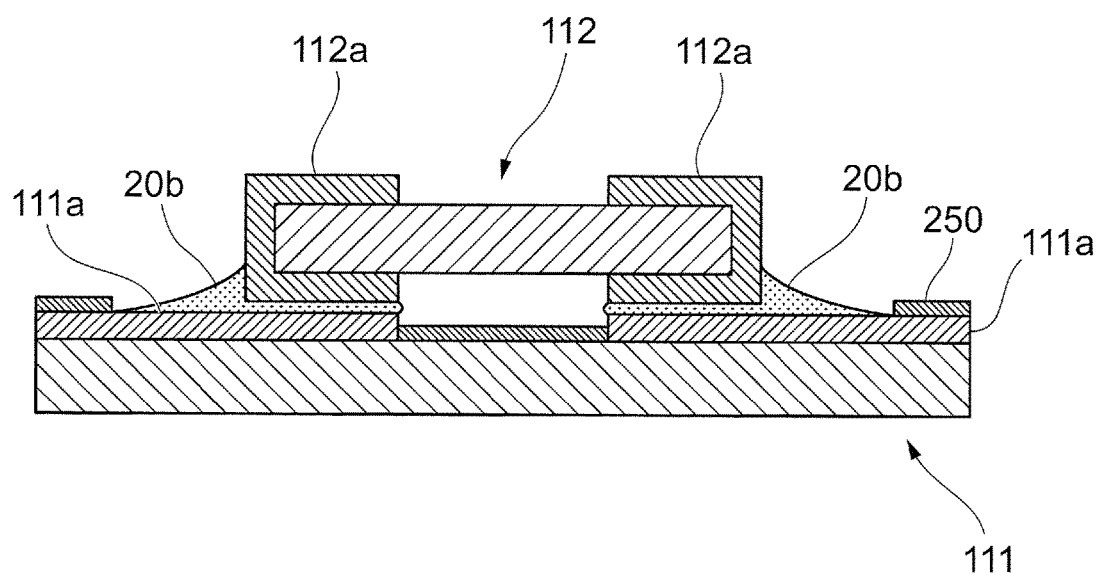
FIG. 7B illustrates a sixth example state of the solder of the present embodiment.

FIG. 7A illustrates a sixth example state of the conventional solder. FIG. 7B illustrates a sixth example state of the solder of the present embodiment.

The figures each show the case where the electrodes 112a of the electronic component 112 are soldered onto the pads 111a of the substrate 111. The figures show changes over time after soldering. FIG. 7A shows soldering with the conventional solder 20a, while FIG. 7B shows soldering with the solder 20b made by using the solder product 20 of the present embodiment.

Comparing FIGS. 7A and 7B, the solder 20a of FIG. 7A is susceptible to cracks Kr. This is because any vibrations to the solder 20a or expansion and contraction thereof due to temperature changes are likely to cause cracks Kr therein if the solder 20a contains solids (such as oxides), acicular crystals, and voids Df. That is, alternate loads may be generated on the printed board or the like and deterioration may progress for a long period, with the result that the conductor environment of the solder may collapse and the conductive function may be lost. Additionally, cracks Kr may often cause oxidation of the solder 20a. In contrast, the solder 20b of FIG. 7B is less likely to contain solids (such as oxides), acicular crystals, and voids Df. Hence, the solder 20b is less susceptible to cracks Kr and thus less susceptible to changes over time. Additionally, since the solder 20b is less susceptible to cracks Kr, the solder 20b is less likely to experience oxidation. Also, the carboxylic acid forms the surface layer 22 at the surface of the solder 20b, as explained with reference to FIG. 1B. As such, the surface layer 22 serves as an oxidation-resistant film, restraining oxidation of the solder 20b and making it further susceptible to changes over time.

Conventional soldering may be performed in a nitrogen reflow system, in which soldering is performed in a nitrogen environment without any oxygen. This method can reduce generation of dross, which is an oxide of solder, during soldering. Thus, this method is expected to bring some improvement when performing soldering at narrow pitches P as explained with reference to FIGS. 2A and 2B. Nevertheless, it would be difficult for this method to achieve improvement to the extent offered by the solder 20b of the present embodiment. Moreover, conventional solders contain solids and acicular crystals and are thus ineffective to restrain cracks Kr described above. Conventional solders are also ineffective to restrain changes over time caused by oxidation as they do not have the surface layer 22.

It should be noted that the present embodiment does not preclude using the nitrogen reflow system to form the solder 20b of the present embodiment; the use of the nitrogen reflow system is expected to further reduce generation of dross, as compared to not using the system.

Figure 8A:
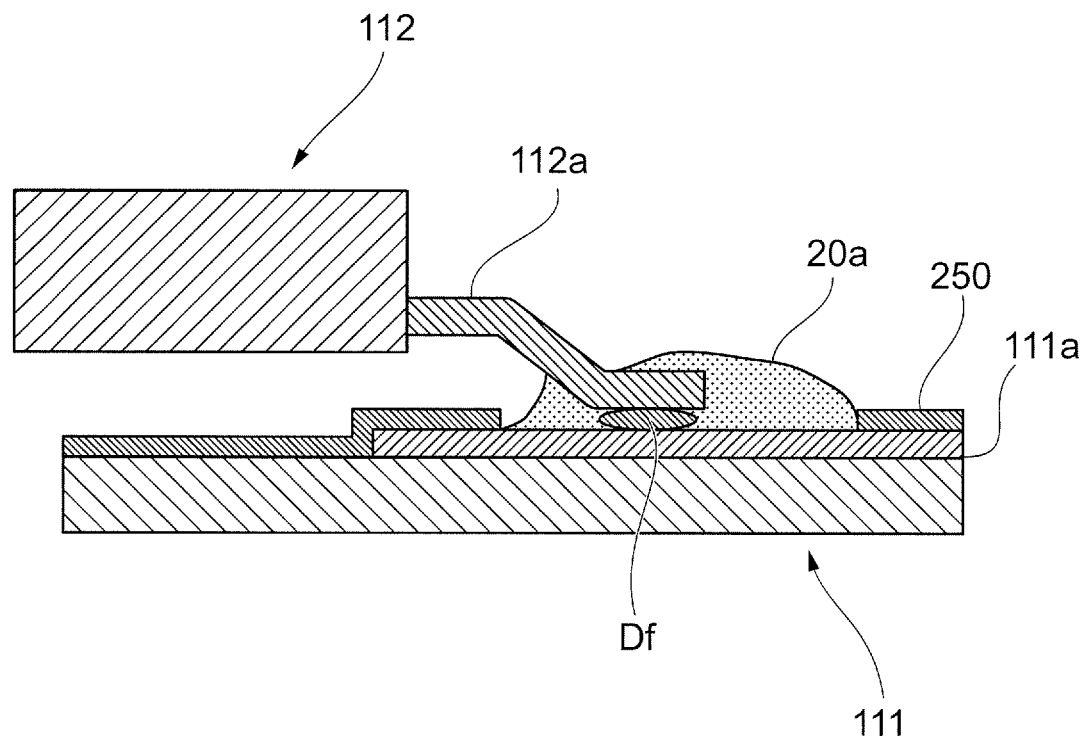
FIG. 8A illustrates a seventh example state of the conventional solder.
Figure 8B:
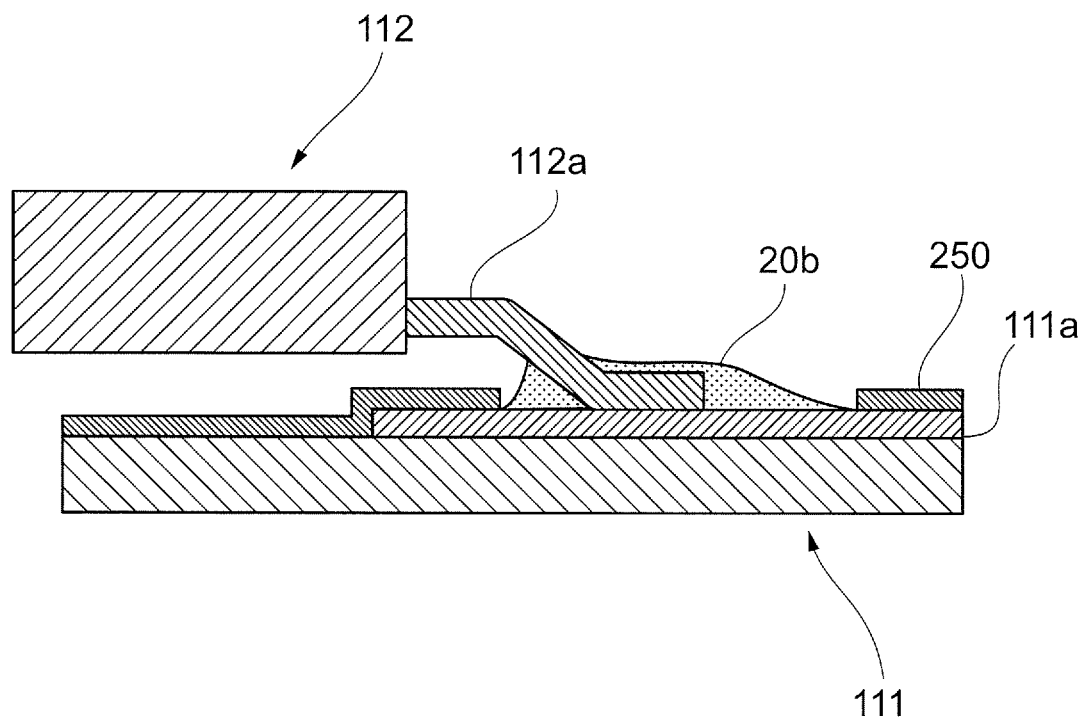
FIG. 8B illustrates a seventh example state of the solder of the present embodiment.

FIG. 8A illustrates a seventh example state of the conventional solder. FIG. 8B illustrates a seventh example state of the solder of the present embodiment.

The figures each show the case where the electrode 112a of the electronic component 112 is soldered onto the pad 111a of the substrate 111. FIG. 8A shows soldering with the conventional solder 20a, while FIG. 5B shows soldering with the solder 20b made by using the solder product 20 of the present embodiment.

Comparing FIGS. 8A and 8B, the solder 20a of FIG. 8A contains solids (such as oxides), acicular crystals, and voids Df. This increases the possibility of floating of components, i.e., a situation where the electronic component 112 is floated up from the substrate 111. In contrast, the solder 20b of FIG. 8B is less likely to contain solids (such as oxides), acicular crystals, and voids Df, which can reduce the possibility of floating of components.

Figure 9A:
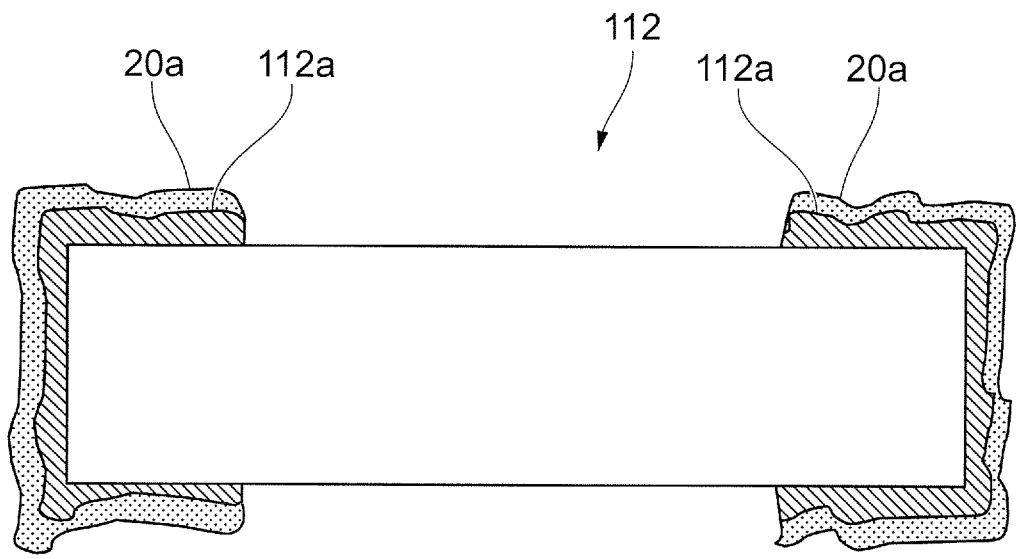
FIGS. 9A and 9B illustrate electronic components before they are soldered onto a substrate.
Figure 9B:
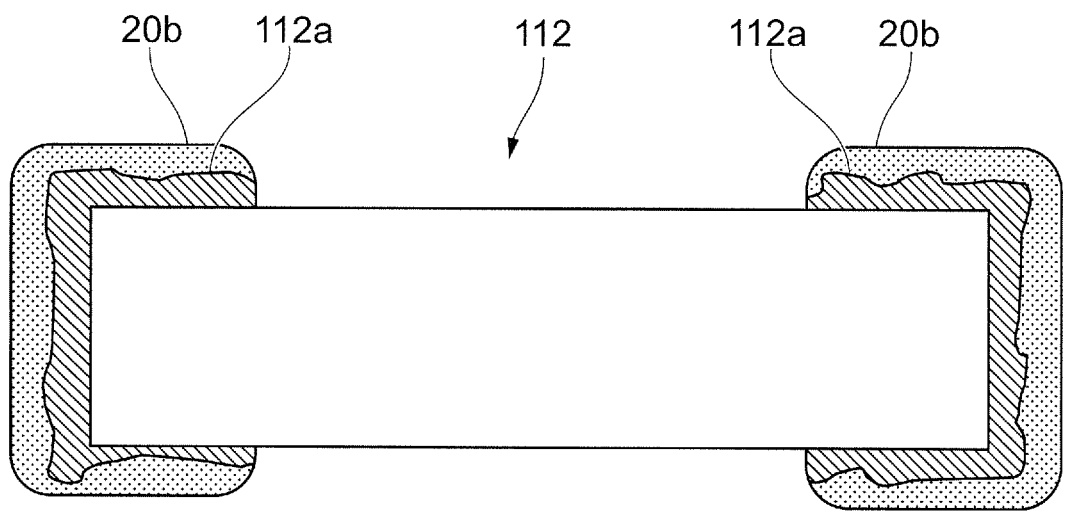

FIGS. 9A and 9B illustrate the electronic component 112 before it is soldered onto the substrate 111.

The electronic component 112 as shown has the electrodes 112a coated with the solder in advance. In this state, the electronic component 112 may be further soldered and joined to the substrate 111, as shown in FIGS. 8A and 8B.

FIG. 9A shows coating with the conventional solder 20a, while FIG. 9B shows coating with the solder 20b made by using the solder product 20 of the present embodiment.

Comparing FIGS. 9A and 9B, the solder 20b of FIG. 9B provides a smoother surface than the solder 20a of FIG. 9A. This is due to the fact that the solder 20b has better flowability and better wettability to the pads 111a than the solder 20a.

Additionally, the solder 20b of FIG. 9B produces a more uniform coating than the solder 20a, so that floating of components, as well as voids Df and cracks Kr, are less likely to occur.

Figure 10A:
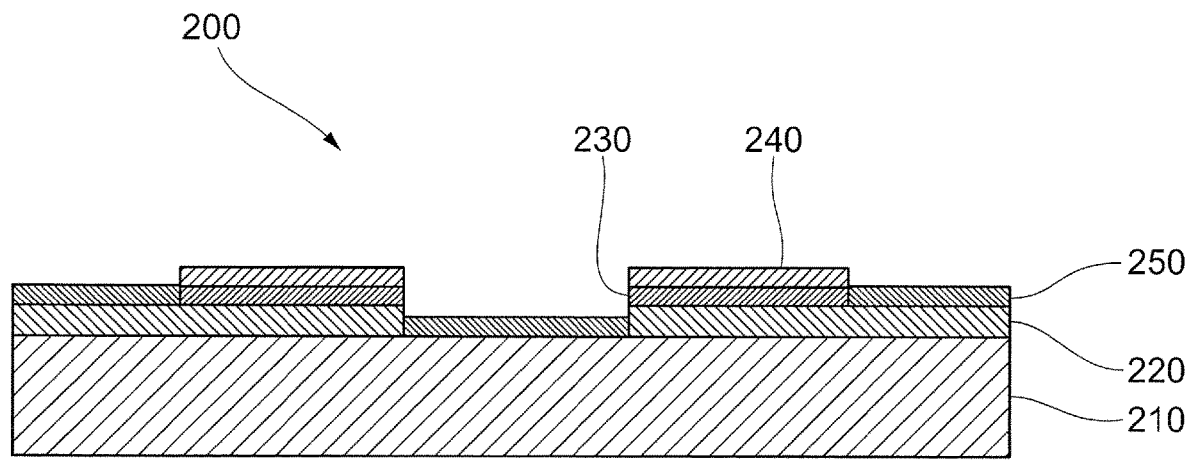
FIG. 10A illustrates an eighth example state of the conventional solder.
Figure 10B:
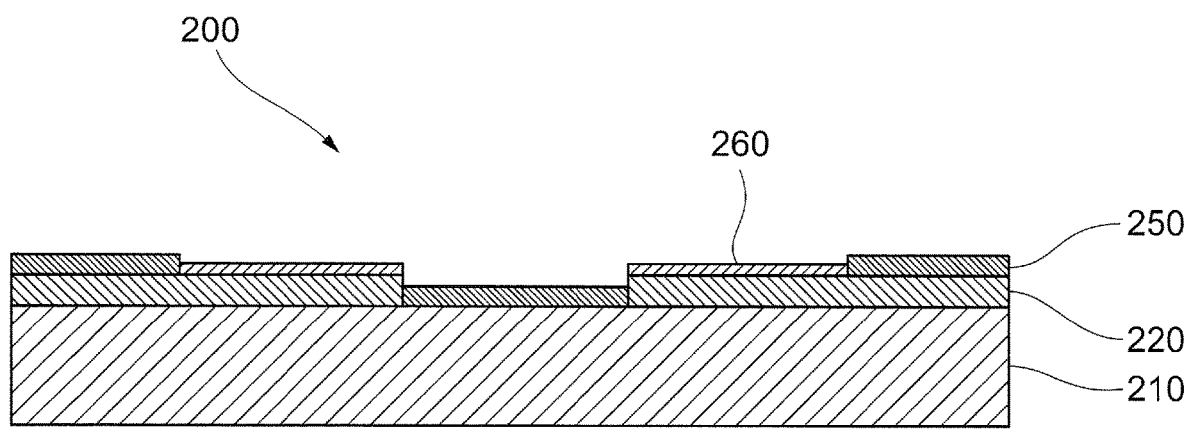
FIG. 10B illustrates an eighth example state of the solder of the present embodiment.

FIG. 10A illustrates an eighth example state of the conventional solder. FIG. 10B illustrates an eighth example state of the solder of the present embodiment.

The figures show a printed board before being mounted with electronic components. The printed board is also called a printed circuit board. FIG. 10A shows a conventional printed board 200, while FIG. 10B shows a printed board 200 using the solder product 20 of the present embodiment.

In the conventional printed board 200 shown in FIG. 10A, a copper pattern 220 as a wiring pattern is applied onto a substrate 210. The copper pattern 220 is an example of a wiring pattern layer that is formed in a thin-film shape on the substrate 210 and constitutes a wiring pattern. Nickel plating 230 and gold plating 240 are laminated on the copper pattern 220. Also, a solder resist 250 is formed to prevent adhesion of the solder 20a. The nickel plating 230 and the gold plating 240 are formed to improve durability of the printed board 200.

The printed board 200 of the present embodiment shown in FIG. 10B is similar to the conventional printed board 200 shown in FIG. 10A in that the copper pattern 220 as a circuit pattern is applied onto the substrate 210 and the solder resist 250 is formed. However, the printed board 200 of the present embodiment differs from the conventional printed board 200 in that the copper pattern 220 is coated thereon with a solder coating 260. The solder coating 260 is made of the solder 20b. The solder coating 260 is an example of a solder layer that is formed in a thin-film shape on the copper pattern 220 and contains a solder.

That is, the printed board 200 of the present embodiment does not need the nickel plating 230 nor the gold plating 240 as they can be replaced with the solder coating 260, which is less expensive. Since the solder coating 260 of the present embodiment is made of the solder 20b, the solder coating 260 is less likely to contain solids (such as oxides), acicular crystals, and voids Df. Additionally, the solder coating 260 is formed with the surface layer 22 as a protective layer and is thus less susceptible to changes over time, which makes the printed board 200 also less susceptible to changes over time. Thus, there is no need for the nickel plating 230 nor the gold plating 240.

The printed board 200 of the present embodiment may further be mounted with the electronic component 112. This printed board is also called a printed wiring board.

Figure 11:
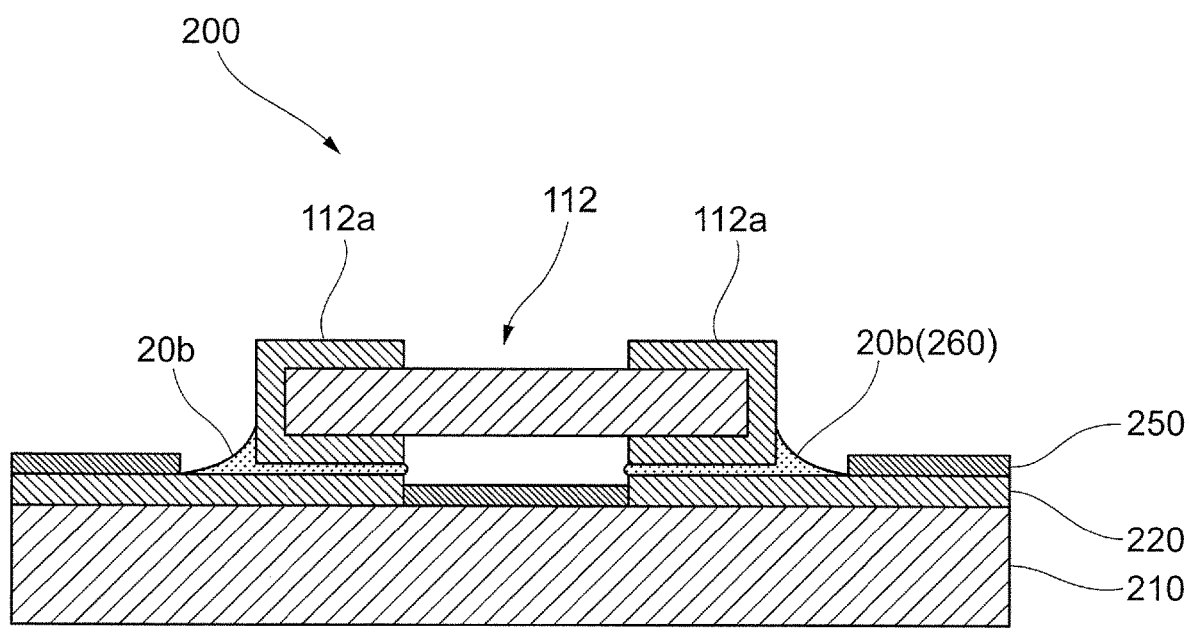
FIG. 11 illustrates a printed board mounted with an electronic component.

FIG. 11 illustrates the printed board 200 mounted with the electronic component 112.

The figure shows the case where the electronic component 112 is joined to the solder coating 260 by soldering. Specifically, the electrodes 112a of the electronic component 112 are soldered by the solder 20b and joined to the solder coating 260. In this case, during soldering by the solder 20b, the solder 20b and the solder coating 260 are once melted and then unified and solidified. Thus, as shown in the figure, they become indistinguishable from each other. Also, in this case, the solder 20b constituting the solder coating 260 and the solder 20b used for soldering may have the same composition, or may have different compositions within the range described above. Regardless of which composition is used, the solder coating 260 and the solder 20b that are free of coarse solids and acicular crystals will provide a greater joining strength.

In an alternative embodiment, the electronic component 112 may be joined by the solder 20b to the conventional printed board 200 shown in FIG. 10A. In this case, the printed board 200 itself before being mounted with the electronic component 112 is a conventional one, but using the solder 20b of the present embodiment for soldering can improve the joining strength and make the printed board 200 less likely to change over time. That is, the solder 20b is less likely to contain solids (such as oxides), acicular crystals, voids Df, and the like than the conventional solder 20a. Hence, the solder 20b is likely to help improve adhesion between joining portions of the printed board 200 and the electronic component 112 and improve the joining strength. As a result, the printed board 200 is less likely to change over time.

[Method for Manufacturing the Solder Product 20]

Below, a description will be given of a method for manufacturing the solder product 20 in accordance with the present embodiment.

Figure 12:
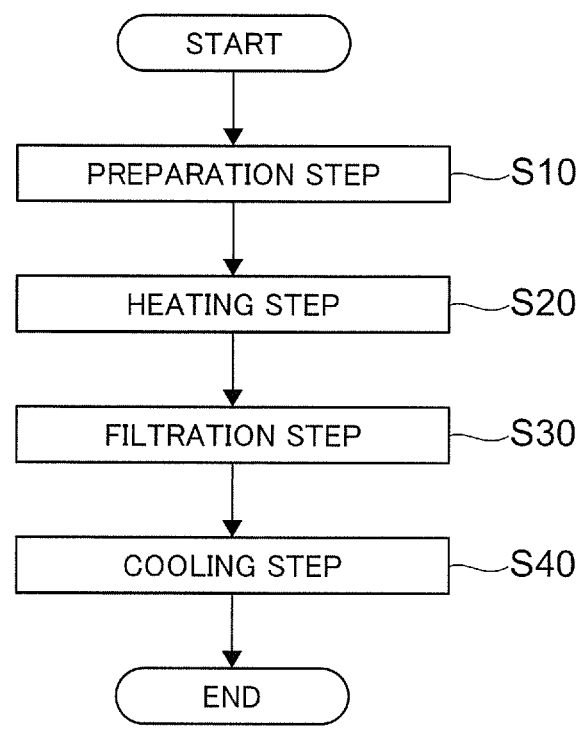
FIG. 12 is a flowchart of a procedure for manufacturing the solder product of the present embodiment.

FIG. 12 is a flowchart of a procedure for manufacturing the solder product 20 of the present embodiment.

First, a preparation step is performed whereby a solder raw material as a raw material of the solder product 20 is prepared (step 10).

At step 10, a solder raw material containing tin as a main component and one or more metal elements other than lead is prepared. At this time, it is preferable that a composition ratio of the metal elements is basically the same as that of the desired solder product 20. It should be noted that the solder raw material prepared at step 10 may actually contain lead as an unavoidable impurity. At step 10, a carboxylic acid having 10 to 20 carbons is also prepared as part of the solder raw material.

Then, a heating step is performed whereby the solder raw material prepared at step 10 is heated and melted to become a molten metal (step 20).

The temperature at step 20 may be any temperature at which the above solder raw material can be melted, but is preferably from about 300° C. to 400° C. for manufacturing the solder product 20 made of the so-called lead-free solder.

The above carboxylic acid, such as a palmitic acid, functions to adsorb oxygen in the molten metal. This reduces mixing of solids (such as oxides) and acicular crystals into the solder product. This also reduces oxygen in the solder product 20. This also makes the solder 20b less susceptible to oxidation during a soldering process. As a result, using the solder 20b of the present embodiment is less likely to generate voids Df.

Also, using the palmitic acid as the carboxylic acid provides an especially excellent oxygen adsorbing function.

Then, a filtration step is performed whereby the molten metal obtained at step 20 is filtered with a filter, which will be detailed later (step 30). In the following description, the molten metal obtained by performing step 20 may be referred to as a "pre-filtration molten metal" and the molten metal obtained by performing step 30 may be referred to as a "post-filtration molten metal". Details of step 30 will be given later.

Then, a cooling step is performed whereby the post-filtration molten metal obtained at step 30 is cooled and solidified to become the solder product 20 (step 40). At this time, the above carboxylic acid is deposited at the surface of the solder product 20 to form the surface layer 22.

At step 40, an appropriate cooling method may be chosen depending on the desired shape (e.g., ingot, wire, or ball) of the solder product 20. For example, when the ingot-shaped solder product 20 is desired, the above post-filtration molten metal may be poured into a mold made of an iron oxide or the like and solidified.

[Details of the Filtration Step]

Figure 13B:
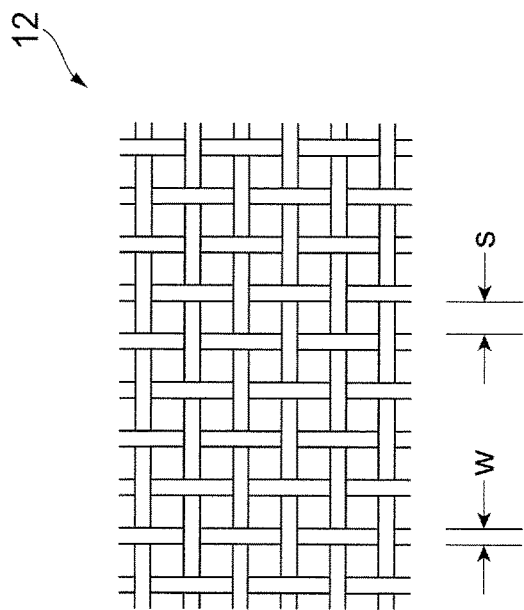
FIGS. 13A to 13C schematically illustrate a filtration step at step 30.
Figure 13C:
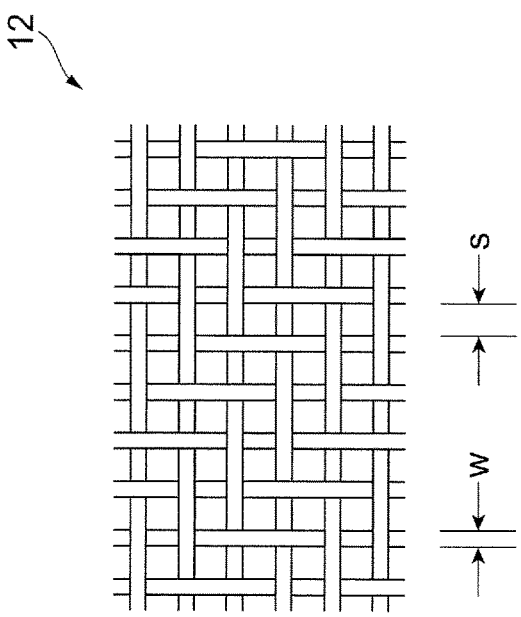
Figure 13A:
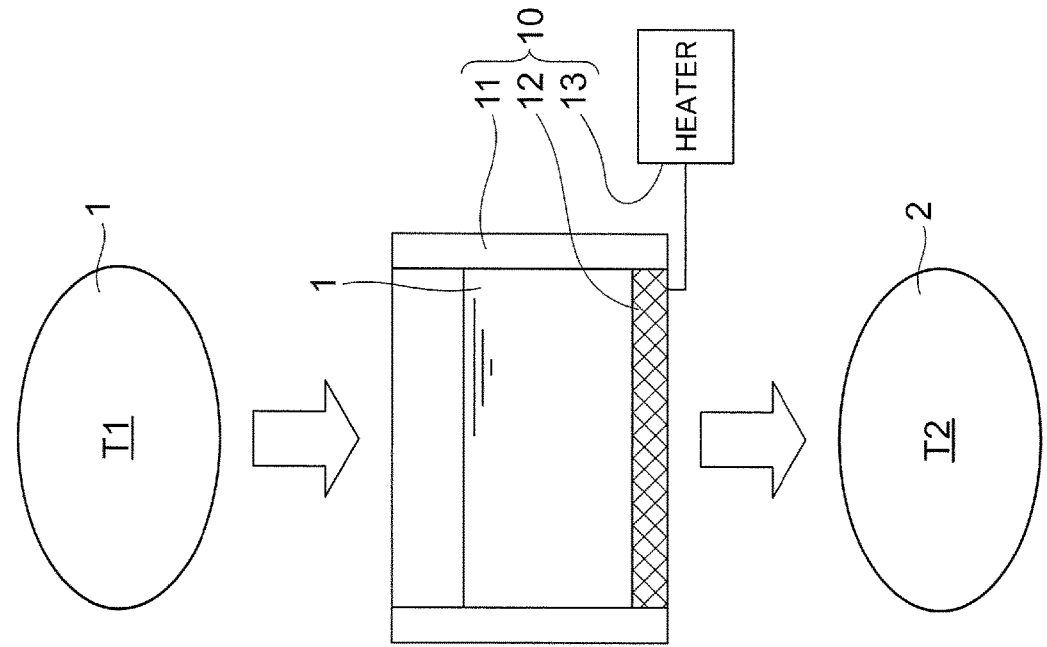

FIG. 13A to 13C schematically illustrate the filtration step at step 30.

FIG. 13A schematically illustrates a filtration apparatus 10 used in the filtration step. FIG. 13B illustrates an example configuration of a filter 12 (details described later) provided in the filtration apparatus 10. FIG. 13C illustrates another example configuration of the filter 12.

(Configuration of the Filtration Apparatus)

The filtration apparatus 10 includes a container 11, the filter 12, and a heater 13. The container 11 is supplied with the pre-filtration molten metal 1 and contains it. The filter 12 is attached to the container 11 to filter the pre-filtration molten metal 1 and pass the post-filtration molten metal 2. The heater 13 heats the filter 12. In the example shown in FIG. 13A, a temperature of the pre-filtration molten metal 1 is assumed to be a pre-filtration temperature T1, and a temperature of the post-filtration molten metal 2 is assumed to be a post-filtration temperature T2.

[Container]

For example, the container 11 assumes a tubular (cylindrical) shape, and two openings of the container 11 face in a vertical (up-down) direction. The container 11 may be made of any material, but it is preferable that a metal material, rather than a ceramic material, is used for the purpose of reducing mixing of oxides and the like into the pre-filtration molten metal 1. Among metal materials, a stainless steel material, in particular SUS 316L, is preferable for the purpose of reducing melting into the pre-filtration molten metal 1.

[Filter]

For example, the filter 12 assumes a planar (disk-like) shape and is attached to close a bottom of the above container 11. An aperture size s of the filter 12 of the present embodiment is set to not more than 10 μm, more preferably not more than 5 μm, and still more preferably not more than 3 μm. Even more preferably, the aperture size s is set to not more than 1 μm. The filter 12 may also be made of any material (e.g., inorganic material, metal material, organic material), but it is preferable to use a metal material, rather than a ceramic material, for the purpose of reducing mixing of oxides and the like into the pre-filtration molten metal 1. Among metal materials, a stainless steel material, in particular SUS 316L, is preferable for the purpose of reducing melting into the pre-filtration molten metal 1. In the case of adopting the filter 12 made of a metal material, either wire mesh made of woven metal wires or a perforated metal sheet obtained by perforating a metal sheet may be adopted provided that the above aperture size s is ensured. However, the wire mesh is more preferred for the filter 12 because it can easily produce a smaller aperture size s. In the case of adopting the wire mesh as the filter 12, sintered wire mesh is preferred for the purpose of reducing variations in the aperture size s. Examples of organic materials available for the filter 12 include various aramid resins and carbon fibers.

In the case of adopting the wire mesh as the filter 12, any of various weaving methods may be adopted, including plain weave, twill weave, plain Dutch weave, and twill Dutch weave. FIG. 13B illustrates an example of the filter 12 made by plain weave, and FIG. 13C illustrates an example of the filter 12 made by twill weave. As shown in the figures, the aperture size s is defined as a gap between two adjacent metal wires used, each having a wire width (diameter) w. In the examples shown in FIGS. 13B and 13C, the aperture size s is larger than the wire width w. This is, however, not essential and there may be cases where the aperture size s is equal to or smaller than the wire width w.

[Heater]

The heater 13 heats the filter 12 using a heat source other than the pre-filtration molten metal 1. Thus, the heater 13 may either directly heat the filter 12 by energization or the like or indirectly heat the filter 12 by heat conduction via the container 11 or other members not shown in the figure.

[Relationship Between the Pre-Filtration Temperature and the Post-Filtration Temperature]

Here, a description will be given of relationship between the pre-filtration temperature T1 of the pre-filtration molten metal 1 and the post-filtration temperature T2 of the post-filtration molten metal 2.

As described above, at the heating step of step 20, the solder raw material is heated to about 300° C. to 400° C. and melted. However, the pre-filtration temperature T1 of the pre-filtration molten metal 1 is about 230° C. to 260° C., and more preferably about 235° C. to 250°. As such, the maximum temperature of the pre-filtration temperature T1 is somewhat lower than the temperature during melting.

Meanwhile, the post-filtration temperature T2 of the post-filtration molten metal 2 is preferably about 230° C. to 260° C. If the post-filtration temperature T2 is too low, the post-filtration molten metal 2 may start solidifying during or immediately after the filtration step, which would greatly decrease the production efficiency of the solder product 20.

(Operations of the Filtration Apparatus)

Now a more detailed description will be given of operations of the filtration apparatus 10 during the filtration step of step 30.

First, the pre-filtration molten metal 1 obtained by heating the solder raw material to 300° C. to 400° C. at the heating step of step 20 is temperature-conditioned to have the pre-filtration temperature T1 (230° C. to 260° C.). Also, the filter 12 is heated by the heater 13 in advance.

Then, the pre-filtration molten metal 1 having had its temperature conditioned to the pre-filtration temperature T1 is fed from above into the container 11 with the filter 12 attached thereto. Thus, most of the pre-filtration molten metal 1 fed into the container 11 passes through the filter 12 and falls down by gravity, resulting in the post-filtration molten metal 2. At this time, pressure may be applied to the pre-filtration molten metal 1 present within the container 11 and on the filter 12, when needed. When pressure is applied, preferable use is made of a gas such as nitrogen (gas inert to the pre-filtration molten metal 1) that is less likely to oxidize the pre-filtration molten metal 1 and is capable of applying isotropic pressure to the pre-filtration molten metal 1.

While the pre-filtration molten metal 1 is being filtered, the filter 12 continues to be heated by the heater 13 to prevent the molten metal from solidifying in the filter 12. It should be noted that the heater 13 should only serve to aid the molten metal in passing through the filter 12, and thus it is preferable for the heater 13 not to heat the filter 12 excessively to the extent that the pre-filtration temperature T1 of the pre-filtration molten metal 1 within the container 11 exceeds the set temperature (230° C. to 260° C.). Filtration may be performed not only once but also multiple times.

The post-filtration molten metal 2 that has passed through the filter 12 is cooled at the above cooling step to become the solder product 20. Meanwhile, a residue (not shown) that has not passed through the filter 12 remains on it. Upon completion of heating by the heater 13 after the filtration step, the filter 12 with the residue thereon is removed from the container 11 and discarded. A new filter 12 is then attached to the container 11.

In the embodiment detailed above, the solder product 20 contains the carboxylic acid having 10 to 20 carbons. Thus, oxygen is adsorbed during manufacturing of the solder product 20, so that generation of solids (such as oxides) and acicular crystals is reduced. This can make the solder patterns finer as shown in FIG. 2B. Additionally, this can provide better flowability and better wettability to electrodes and substrates as shown in FIG. 3B and other figures, so that the solder application amount can be reduced. Moreover, solids, acicular crystals, and voids Df are less likely to occur as shown in FIG. 6B and other figures, so that occurrence of cracks Kr can be reduced. Hence, the solder product 20 is less susceptible to changes over time and has excellent durability.

In the resultant solder product 20, the carboxylic acid is present as the surface layer 22 at the surface of the solder product 20 and serves as a protective layer. This makes the solder 20b less susceptible to changes over time by oxidation and moisture absorption and excellent in durability.

As shown in FIG. 10B, using the solder 20b for the printed board 200 eliminates the need for the nickel plating 230 and the gold plating 240. As a result, reduction of $CO_2$ emissions can also be expected.

Since adding the carboxylic acid having 10 to 20 carbons can reduce generation of solids (such as oxides) and acicular crystals, the above filtration step of step 30 may be omitted in some cases depending on the required performance of the solder product 20.

Also, since performing the above filtration step of step 30 can remove solids (such as oxides) and acicular crystals, there may be no need to add the carboxylic acid having 10 to 20 carbons in some cases. That is, the filtration step ensures that the solder product 20 contains little or no solids (such as oxides) and acicular crystals, providing the same effects as described above. Hence, in some cases it may be enough to either add the carboxylic acid having 10 to 20 carbons or perform the filtration step of step 30 in order to produce the solder product 20.

[Method for Manufacturing Tin Article]

A method for manufacturing a tin article in accordance with the present embodiment will now be described. First, a first embodiment of the method for manufacturing a tin article will be described.

First Embodiment

Figure 14A:
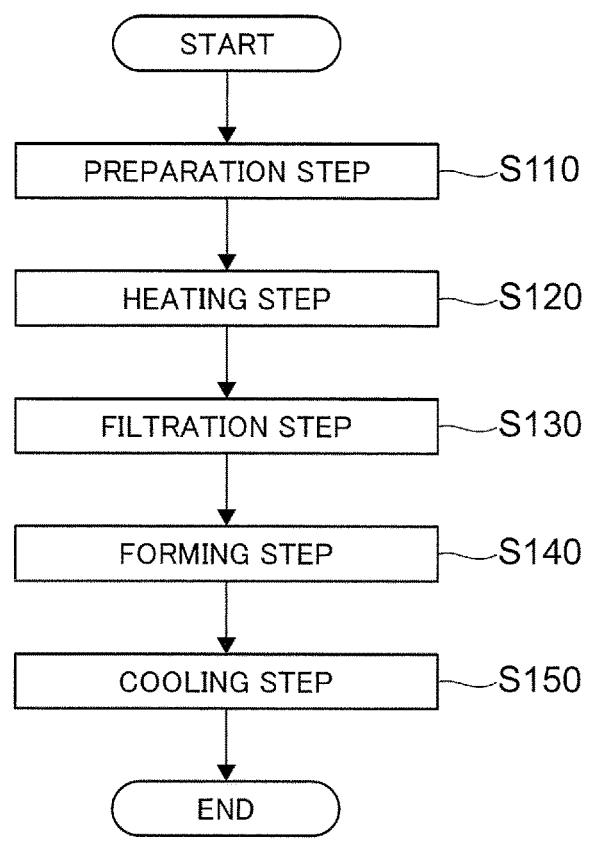
FIG. 14A is a flowchart of a procedure for manufacturing a tin article of a first embodiment.

FIG. 14A is a flowchart of a procedure for manufacturing a tin molded particle of the first embodiment.

First, a preparation step is performed whereby a raw material of the tin article is prepared (step 110).

At step 110, tin as a main component is prepared as the raw material. In addition to tin as the main component, one or more metal elements other than lead and cadmium may be added as secondary components depending on required characteristics of the tin article. The one or more metal elements may be at least one of silver, copper, antimony, and bismuth. The required characteristics of the tin article may include workability, rigidity of the finished tin article, and aesthetics (e.g., brightness or dullness) of the finished tin article. At this time, it is preferable that a composition ratio of the metal elements is basically the same as that of the desired tin article. It should be noted that the raw material prepared at step 110 may actually contain lead as an unavoidable impurity.

Then, a heating step is performed whereby the raw material prepared at step 110 is heated and melted to become a molten metal (step 120).

The temperature at step 120 may be set to any temperature at which the above raw material can be melted, but is preferably from about 300° C. to 400° C.

Then, a filtration step is performed whereby the molten metal obtained at step 120 is filtered by a filter, which will be detailed later (step 130). In the following description, the molten metal obtained by performing step 120 may be referred to as a "pre-filtration molten metal" and the molten metal obtained by performing step 130 may be referred to as a "post-filtration molten metal". Details of step 130 will be given later.

Then, a forming step is performed whereby the post-filtration molten metal obtained at step 130 is poured into a mold in the shape of the tin article and shaped into the tin article (step 140). The mold is made of an iron oxide or the like.

A cooling step is then performed whereby the post-filtration molten metal in the shape obtained at step 140 is cooled and solidified to become the tin article (step 150).

A second embodiment of the method for manufacturing a tin article will be described below.

Second Embodiment

Figure 14B:
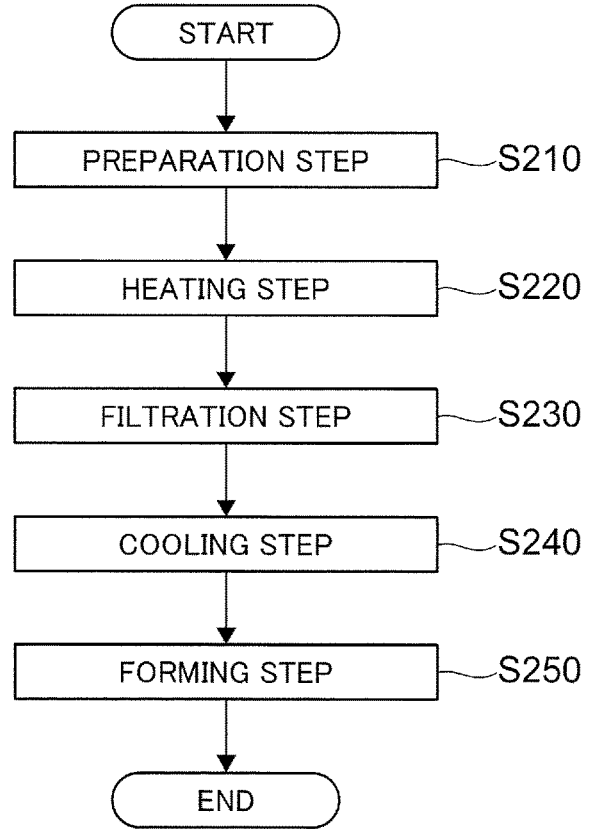
FIG. 14B is a flowchart of a procedure for manufacturing a tin article of a second embodiment.

FIG. 14B is a flowchart of the method for manufacturing a tin article of the second embodiment.

In FIG. 14B, steps 210-230 are the same as steps 110-130 in FIG. 14A, so that descriptions thereof are omitted.

As regards step 240 and onwards, first, a cooling step is performed whereby the post-filtration molten metal obtained at step 230 is cooled and solidified to become a tin intermediate product (step 240). In this case, the tin intermediate product is a product that is used as a material to form a tin article. The tin intermediate product may have any required shape to produce the tin molted article. Examples of the shape include ingot shape, planar shape, rod shape, wire shape, and ball shape.

At step 240, an appropriate cooling method may be chosen depending on the desired shape of the tin intermediate product. For example, when the ingot-shaped tin intermediate product is desired, the above post-filtration molten metal may be poured into a mold made of an iron oxide or the like and solidified. For example, when the planar tin intermediate product is desired, the above post-filtration molten metal may be pressed between rollers or the like and solidified. Steps 210-240 may be regarded as a method for manufacturing a tin intermediate product.

Then, a forming step is performed whereby the tin intermediate product obtained at step 240 is processed and shaped into a tin article (step 250). The tin intermediate product may be processed using any processing method for metal materials, including, for example, pressing, hammering, bending, twisting, cutting, milling, polishing, etching, surface treating, and sandblasting.

It should be noted that additional steps may be added after the cooling step of step 150 or the forming step of step 250. Such additional steps may include applying gold leaf to the surface and coloring the surface. In this case, a colored layer is formed at the surface of the tin article. This can be regarded as a coloring step of forming a colored layer at the surface of the tin article to color it.

The tin article manufactured by the steps shown in FIGS. 14A and 14B may be any article that can be formed through the forming step. Examples of the tin article include tableware such as cups with or without handles, tea bowls, saucers, bowls, rice bowls, spoons, and chopstick rests. Examples of the tin article further include accessories such as pendants and brooches. Examples of the tin article further include commodities such as vases, flowerpots, water buckets, and washbowls.

An apparatus used for the filtration step may be similar to that used for producing the solder product 20, and the filtration apparatus 10 may be used. Operations of the filtration apparatus 10 may also be similar to those for producing the solder product 20.

[Raw Material]

In addition to the above metal elements, a carboxylic acid having 10 to 20 carbons may also be added to the raw material.

FIGS. 15A and 15B illustrate a tin article containing the carboxylic acid having 10 to 20 carbons.

FIG. 15A illustrates a tin article 30, and FIG. 15B illustrates an enlarged cross-section of a surface portion of the tin article 30 shown in FIG. 15A.

As shown in FIG. 15B, the tin article 30 of the present embodiment includes a tin base body 31 and a surface layer 32. Thus, the tin article 30 can be said to include the tin base body 31, which is composed of tin as a main component, and the carboxylic acid having 10 to 20 carbons mainly distributed over the surface of the tin article 30 to form the surface layer 32.

The tin base body 31 is mainly composed of the tin article described above. That is, the tin base body 31 contains tin (Sn) as its main component. In addition to tin as the main component, the tin base body 31 may further contain one or more metal elements other than lead and cadmium as secondary components, depending on required characteristics of the tin article.

The surface layer 32 mainly consists of the carboxylic acid described above. In other words, the carboxylic acid is mainly distributed over the surface of the tin article 30 to form the surface layer 32. The surface layer 32 covers the entire surface of the tin article 30. For example, the carboxylic acid is more localized at the surface of the tin article 30 to thereby form the surface layer 32.

In that way, the surface layer 32 serves as a protective layer for the tin base body 31. That is, the surface layer 32 prevents oxygen and moisture in the air from reaching the tin base body 31. The surface layer 32 can be thus regarded as an oxidation-resistant film or a water-resistant film.

The carboxylic acid is preferably same as that used in the above solder product 20. That is, the carboxylic acid is more preferably a fatty acid having 12 to 16 carbons. In particular, a monovalent fatty acid having 12 to 16 carbons is still more preferable. In particular, a monovalent saturated fatty acid having 12 to 16 carbons is yet more preferable. In particular, a palmitic acid having 16 carbons is even still more preferable.

Below, a description will be given of a conductive member as a modification to the above tin article.

(Conductive Member)

A "conductive member" as referred to in the present embodiment is a member that contains, at least in some portions thereof, the tin base body 31 and the surface layer 32 described above. Examples of the conductive member include wires, substrates, and terminals. The conductive member may either entirely consist of the tin base body 31 and the surface layer 32 or use the tin base body 31 and the surface layer 32 in some portions thereof. Examples of the conductive member that uses the tin base body 31 and the surface layer 32 in some portions thereof include a planar electronic component having a planar conductor covered with the tin base body 31 and the surface layer 32. The planar conductor is, for example, a copper plate.

Among these, the "wire" refers to an electric wire that contains, at least in some portions thereof, the tin base body 31 and the surface layer 32 described above. The wire may either entirely consist of the tin base body 31 and the surface layer 32 or use the tin base body 31 and the surface layer 32 in some portions thereof. Examples of the wire that uses the tin base body 31 and the surface layer 32 in some portions thereof include an electric wire having a linear conductor covered with the tin base body 31 and the surface layer 32. The linear conductor is, for example, a copper wire. That is, in this case, the wire is coated with the tin base body 31 and the surface layer 32 on an outer surface of the copper wire. The wire may further include an insulating coating that covers the outer surface of the tin base body 31 and the surface layer 32 covering the copper wire. The insulating coating is made of resin or the like, for example. This means that the wire may be an insulated electric wire.

Below, a description will be given of a flexible printed board as a modification to the above tin article.

(Flexible Printed Board)

A "flexible printed board" (or flexible printed circuits (FPC)) as referred to in the present embodiment is a printed board that is flexible. For example, the flexible printed board assumes a thin-film shape and has a structure in which an adhesive layer is formed on an insulator base film and conductor foil is bonded onto the adhesive layer. The flexible printed board includes terminals for connection with connectors or the like. The terminals may also be called electrodes. The terminals typically and conventionally have their conductive foil covered with gold leaf or the like. In contrast, the terminals of the flexible printed board of the present embodiment have their conductive foil surfaces covered with the tin base body 31 and the surface layer 32 described above. The conductive foil is, for example, copper foil made of copper. Thus, in this case, the terminals of the flexible printed board have their copper foil surfaces coated with the tin base body 31 and the surface layer 32. Conventionally, a portion to be plated needs cleaning beforehand to be plated with gold leaf, and a cleaning agent used for cleaning may remain after cleaning. This residual cleaning agent may cause failures such as contact failures, cracks, and deterioration of joints. The present embodiment can coat the terminals with the tin base body 31 and the surface layer 32 without the need for cleaning the terminals beforehand. Thus, no cleaning agent will remain. Hence, the above failures are less likely occur and, moreover, reduction of $CO_2$ emissions can be expected. Additionally, using the tin base body 31 and the surface layer 32 of the present embodiment allows patterns to be formed with narrow gaps. This means that gaps between the multiple terminals of the flexible printed board can be made narrower as well.

Further, a description will be given of an electronic component as a modification to the above tin article.

(Electronic Component)

An "electronic component" as referred to in the present embodiment is a component that is a part of an electronic circuit and includes terminals for electrical connection with a board or other electronic components. The electronic component is not limited to a particular component, and examples may include capacitors, resistors, sensors, semiconductors, integrated circuits, connectors, and micro LED panels. The terminals may also be called electrodes. The terminals have their surfaces coated with the tin base body 31 and the surface layer 32 described above. The conductive wire is a copper wire made of copper. Thus, in this case, the terminals of the electronic component are coated with the tin base body 31 and the surface layer 32 on the copper wire surfaces. Covering the terminals of the electronic component of the present embodiment with the tin base body 31 and the surface layer 32 of the present embodiment is effective to reduce floating of components and cracks, improve the flowability and wettability characteristics, and realize a uniform application amount.

EXAMPLES

Below, a further description will be given of the solder product of the present invention based on examples. However, the present invention should not be construed as being limited to the examples given below, and other examples are also possible without departing from the scope of the invention.

The present inventors manufactured multiple types of solder products under manufacturing conditions with or without the filtration step and with different aperture sizes s of the filter 12 used in the filtration step. The present inventors evaluated performance of the thus-obtained solder products.

Description of Examples and Comparative Examples

Table 1 below shows conditions set for the filtration step of step 30 for manufacturing solder products of Examples 1 to 3 and Comparative Examples 1 to 3.

TABLE 1

| EXAMPLES/COMPARATIVE EXAMPLES | FILTER | APERTURE SIZE |
|---|---|---|
| EXAMPLE 1 | PRESENT | 3 μm |
| EXAMPLE 2 | PRESENT | 5 μm |
| EXAMPLE 3 | PRESENT | 10 μm |
| COMPARATIVE EXAMPLE 1 | PRESENT | 20 μm |
| COMPARATIVE EXAMPLE 2 | PRESENT | 100 μm |
| COMPARATIVE EXAMPLE 3 | ABSENT | — |

In each of Examples 1 to 3 and Comparative Examples 1 to 3, a mixture of a mass of tin and a mass of copper containing 0.7 wt. % of copper with the balance of tin was used as the solder raw material to manufacture a solder product generally called "Sn0.7Cu". Thus, in each of Examples 1 to 3 and Comparative Examples 1 to 3, the solder raw material was free of solder fragments such as dross.

Example 1

In Example 1, the solder product was manufactured through the filtration step using the filter 12 (filter: present). More specifically, in Example 1, the pre-filtration molten metal 1 obtained by heating the above solder material was filtered with the filter 12 having the aperture size s of 3 μm, and the resulting post-filtration molten metal 2 was cooled to obtain the solder product.

Example 2

In Example 2, the solder product was manufactured through the filtration step using the filter 12 (filter: present). More specifically, in Example 2, the pre-filtration molten metal 1 obtained by heating the above solder material was filtered with the filter 12 having the aperture size s of 5 μm, and the resulting post-filtration molten metal 2 was cooled to obtain the solder product.

Example 3

In Example 3, the solder product was manufactured through the filtration step using the filter 12 (filter: present). More specifically, in Example 3, the pre-filtration molten metal 1 obtained by heating the above solder material was filtered with the filter 12 having the aperture size s of 10 μm, and the resulting post-filtration molten metal 2 was cooled to obtain the solder product.

Comparative Example 1

In Comparative Example 1, the solder product was manufactured through the filtration step using the filter 12 (filter: present). More specifically, in Comparative Example 1, the pre-filtration molten metal 1 obtained by heating the above solder material was filtered with the filter 12 having the aperture size s of 20 μm, and the resulting post-filtration molten metal 2 was cooled to obtain the solder product.

Comparative Example 2

In Comparative Example 2, the solder product was manufactured through the filtration step using the filter 12 (filter: present). More specifically, in Comparative Example 2, the pre-filtration molten metal 1 obtained by heating the above solder material was filtered with the filter 12 having the aperture size s of 100 μm, and the resulting post-filtration molten metal 2 was cooled to obtain the solder product.

Comparative Example 3

In Comparative Example 3, the solder product was manufactured without the filtration step using the filter 12 (filter: absent). More specifically, in Comparative Example 3, the pre-filtration molten metal 1 was directly cooled to obtain the solder product.

[Evaluation of Solder Products]

As measures to evaluate the solder products of the examples and the comparative examples, occurrence of bridges (solder bridges) in the solders obtained by using each solder product for soldering, viscosity of the solder melt obtained by melting each solder product, and oxygen concentration in the solders obtained by using each solder product for soldering were used.

(Solder Bridge)

First, the solder bridge evaluation will be described. Here, all solder products of Examples 1 to 3 and Comparative Examples 1 to 3 were subjected to the solder bridge evaluation.

[Evaluation Substrate]

FIGS. 16A to 16C explain a configuration of an evaluation substrate 100 used for the solder bridge evaluation. FIG. 16A is a top view of the evaluation substrate 100, showing its surface on which first to third pattern groups 101 to 103 (details described later) are formed. FIG. 16B illustrates configurations of first to fifth electrode groups A to E (details described later) constituting the first pattern group 101. FIG. 16C illustrates an electrode width F and an electrode height I of a simulated electrode 110 (details described later) and a gap G and a pitch H between two adjacent simulated electrodes 110, in each of the first to fifth electrode groups A to E.

The evaluation substrate 100 is composed of a rectangular board made of a glass epoxy material (FR-4) (a glass epoxy board with a thickness of about 1.5 mm) and a plurality of simulated electrodes (with a thickness of 18 μm) each made of a copper layer. The evaluation substrate 100 includes pattern groups formed on one side of the glass epoxy board. The evaluation substrate 100 is obtained by removing, through an etching process, some portions of copper foil of a substrate material including the glass epoxy board and the copper foil. In the following description, the transverse direction (up-down direction in FIG. 16A) of the evaluation substrate 100 shown in FIG. 16A may be referred to as a "vertical direction", and the longitudinal direction (right-left direction in FIG. 16A) thereof may be referred to as a "horizontal direction".

The evaluation substrate 100 includes, as the pattern groups, a first pattern group 101 arranged along the horizontal direction in the uppermost row in the vertical direction, a second pattern group 102 arranged along the horizontal direction in the intermediate row in the vertical direction, and a third pattern group 103 arranged along the horizontal direction in the lowermost row in the vertical direction. As these first to third pattern groups 101 to 103 are similar in configuration, only the first pattern group 101 will be described below.

The first pattern group 101 includes a first electrode group A located at the leftmost side of the evaluation substrate 100 in the figure, a second electrode group B right-adjacent to the first electrode group A, a third electrode group C right-adjacent to the second electrode group B, a fourth electrode group D right-adjacent to the third electrode group C, and a fifth electrode group E right-adjacent to the fourth electrode group D and located at the rightmost side of the evaluation substrate 100 in the figure. Each of the first electrode group A, the second electrode group B, the third electrode group C, the fourth electrode group D, and the fifth electrode group E includes thirty-one rectangular simulated electrodes 110 arranged in the horizontal direction and each extending in the vertical direction.

In the first electrode group A, the electrode width F is set to 0.2 mm, the gap G is set to 0.5 mm, the pitch H is set to 0.7 mm, and the electrode height I is set to 15 mm. In the second electrode group B, the electrode width F is set to 0.2 mm, the gap G is set to 0.4 mm, the pitch H is set to 0.6 mm, and the electrode height I is set to 15 mm. In the third electrode group C, the electrode width F is set to 0.2 mm, the gap G is set to 0.3 mm, the pitch H is set to 0.5 mm, and the electrode height I is set to 15 mm. In the fourth electrode group D, the electrode width F is set to 0.2 mm, the gap G is set to 0.2 mm, the pitch H is set to 0.4 mm, and the electrode height I is set to 15 mm. In the fifth electrode group E, the electrode width F is set to 0.15 mm, the gap G is set to 0.15 mm, the pitch H is set to 0.3 mm, and the electrode height I is set to 15 mm.

Thus, the first electrode group A has dimensions of 21 mm in the horizontal direction and 15 mm in the vertical direction. The second electrode group B has dimensions of 18 mm in the horizontal direction and 15 mm in the vertical direction. The third electrode group C has dimensions of 15 mm in the horizontal direction and 15 mm in the vertical direction. The fourth electrode group D has dimensions of 12 mm in the horizontal direction and 15 mm in the vertical direction. The fifth electrode group E has dimensions of 9 mm in the horizontal direction and 15 mm in the vertical direction.

Here, two types of the evaluation substrates 100 described above were prepared, one of which was subjected to a predetermined surface treatment, and the other of which was not subjected to the surface treatment. In the following description, the evaluation substrate 100 not subjected to the surface treatment may be referred to as an "untreated substrate", and the evaluation substrate 100 subjected to the surface treatment may be referred to as a "treated substrate". As regards the untreated substrate, the glass epoxy board formed thereon with the pattern groups through an etching process was only subjected to water washing. As regards the treated substrate, the glass epoxy board formed thereon with the pattern groups through an etching process was subjected to water washing and then a treatment to remove oxides present on the surface.

[Testing Method]

A description will be given of a testing method conducted for evaluating solder bridges using the evaluation substrate 100 described above. Soldering on the evaluation substrate 100 was performed under conditions simulating a so-called flow soldering.

First, a relevant solder product (any of the solder products of Examples 1 to 3 and Comparative Examples 1 to 3) was fed into a solder bath made of SUS 316L (not shown) and heated to obtain a solder melt composed of the molten solder product. Then, the temperature of the solder melt within the solder bath was adjusted to 250° C. Then, the evaluation substrate 100 (either the untreated substrate or the treated substrate) was moved vertically downward from above the solder bath into the solder melt within the solder bath such that the first pattern group 101 was on the upper side and the third pattern group 103 was on the lower side. Thus, the evaluation substrate 100 was immersed in the solder melt.

The moving speed of the evaluation substrate 100 at this time was 60 mm/s. In the state where the entire evaluation substrate 100 was immersed in the solder melt, the evaluation substrate 100 was stopped from moving and held (immersed) for three seconds. Subsequently, the evaluation substrate 100 was moved vertically upward from the solder bath to remove the immersed evaluation substrate 100 from the solder melt. The moving speed of the evaluation substrate 100 at this time was 60 mm/s.

Each simulated electrode 110 on the evaluation substrate 100 removed from the solder melt in this manner will have a solder attached thereto that has migrated from the solder melt and solidified by being cooled. At this time, however, solders respectively attached to two adjacent simulated electrodes 110 of the evaluation substrate 100 may join with each other depending on the state of the source solder melt. This phenomenon in which the solders attached to two adjacent simulated electrodes 110 join with each other is herein referred to as "occurrence of a solder bridge".

[Evaluation Method]

Below, a description will be given of a method for evaluating the occurrence of solder bridges for the evaluation substrate 100 having had the solder attached thereto in the above manner.

The evaluation substrate 100 (either the untreated substrate or the treated substrate) with the solder attached thereto obtained by the aforementioned procedure was visually observed to examine the occurrence of solder bridges on each evaluation substrate 100.

As described above, each evaluation substrate 100 is provided with three pattern groups (the first to third pattern groups 101 to 103) and each pattern group is provided with five electrode groups (the first to fifth electrode groups A to E). As each electrode group is composed of thirty-one simulated electrodes 110, the maximum number of solder bridges occurring in each electrode group is thirty. In one electrode group, solder bridges formed at two or more locations between two adjacent simulated electrodes 110 were counted as one occurrence. On the scale of the entire evaluation substrate 100, the maximum number of solder bridges occurring in three electrode groups having the same configuration (e.g., three first electrode groups A) is ninety.

[Evaluation Results]

The results of the solder bridge evaluation will now be described.

Table 2 shows the occurrence of solder bridges on the treated substrate (evaluation substrate 100) that underwent soldering using the solder product of Example 1. Table 3 shows the occurrence of solder bridges on the treated substrate (evaluation substrate 100) that underwent soldering using the solder product of Comparative Example 3. Table 4 shows the occurrence of solder bridges on the untreated substrate (evaluation substrate 100) that underwent soldering using the solder product of Example 1. Table 5 shows the occurrence of solder bridges on the untreated substrate (evaluation substrate 100) that underwent soldering using the solder product of Comparative Example 3.

Tables 2 to 5 each show relationship between the number of solder bridges occurring in each of the first to fifth electrode groups A to E constituting the first to third pattern groups 101 to 103 formed on the evaluation substrate 100 and the total number and occurrence rate (%) of solder bridges occurring in three electrode groups having the same configuration (for each of the first to fifth electrode groups A to E).

TABLE 2

| EXAMPLE 1 (TREATED SUBSTRATE) | A | B | C | D | E |
|---|---|---|---|---|---|
| 1ST PATTERN GROUP 101 | 0 | 0 | 0 | 9 | 20 |
| 2nd PATTERN GROUP 102 | 0 | 0 | 9 | 15 | 15 |
| 3rd PATTERN GROUP 103 | 0 | 2 | 2 | 6 | 9 |
| TOTAL NO. OF SOLDER BRIDGES | 0 | 2 | 11 | 30 | 44 |
| SOLDER BRIDGE OCCURRENCE RATE (%) | 0 | 2 | 12 | 33 | 49 |

TABLE 3

| COMPARATIVE EXAMPLE 3 (TREATED SUBSTRATE) | A | B | C | D | E |
|---|---|---|---|---|---|
| 1ST PATTERN GROUP 101 | 0 | 0 | 2 | 8 | 24 |
| 2nd PATTERN GROUP 102 | 0 | 3 | 11 | 28 | 27 |
| 3rd PATTERN GROUP 103 | 1 | 7 | 9 | 12 | 30 |
| TOTAL NO. OF SOLDER BRIDGES | 1 | 10 | 22 | 48 | 81 |
| SOLDER BRIDGE OCCURRENCE RATE (%) | 1 | 11 | 24 | 53 | 90 |

TABLE 4

| EXAMPLE 1 (UNTREATED SUBSTRATE) | A | B | C | D | E |
|---|---|---|---|---|---|
| 1ST PATTERN GROUP 101 | 0 | 0 | 0 | 9 | 14 |
| 2nd PATTERN GROUP 102 | 0 | 0 | 4 | 14 | 11 |
| 3rd PATTERN GROUP 103 | 0 | 0 | 2 | 1 | 0 |
| TOTAL NO. OF SOLDER BRIDGES | 0 | 0 | 6 | 24 | 25 |
| SOLDER BRIDGE OCCURRENCE RATE (%) | 0 | 0 | 6.7 | 27 | 28 |

TABLE 5

| COMPARATIVE EXAMPLE 3 (UNTREATED SUBSTRATE) | A | B | C | D | E |
|---|---|---|---|---|---|
| 1ST PATTERN GROUP 101 | 21 | 16 | 17 | 21 | 30 |
| 2nd PATTERN GROUP 102 | 25 | 30 | 28 | 30 | 30 |
| 3rd PATTERN GROUP 103 | 30 | 30 | 30 | 30 | 30 |
| TOTAL NO. OF SOLDER BRIDGES | 76 | 76 | 75 | 81 | 90 |
| SOLDER BRIDGE OCCURRENCE RATE (%) | 84 | 84 | 83 | 90 | 100 |

Example 1 (Treated Substrate)

First, with reference to Table 2, a description will be given of the occurrence of solder bridges on the treated substrate (evaluation substrate 100) that underwent soldering using the solder product of Example 1. Hereinafter, this substrate is referred to as "Example 1 (treated substrate)". Similar notations will be used for the other substrates discussed below.

In the case of Example 1 (treated substrate), the total number of solder bridges in all first electrode groups A was zero (occurrence rate: 0%), the total number of solder bridges in all second electrode groups B was two (occurrence rate: 2%), and the total number of solder bridges in all third electrode groups C was eleven (occurrence rate: 12%). Also, in the case of Example 1 (treated substrate), the total number of solder bridges in all fourth electrode groups D was thirty (occurrence rate: 33%), and the total number of solder bridges in all fifth electrode groups E was forty four (occurrence rate: 49%). Thus, the occurrence rate of solder bridges in Example 1 (treated substrate) was 0% at the lowest and less than 50% (49%) at the highest.

Comparative Example 3 (Treated Substrate)

With reference to Table 3, the occurrence of solder bridges in Comparative Example 3 (treated substrate) will be described.

In the case of Comparative Example 3 (treated substrate), the total number of solder bridges in all first electrode groups A was one (occurrence rate: 1%), the total number of solder bridges in all second electrode groups B was ten (occurrence rate: 11%), and the total number of solder bridges in all third electrode groups C was twenty two (occurrence rate: 24%). Also, in the case of Comparative Example 3 (treated substrate), the total number of solder bridges in all fourth electrode groups D was forty eight (occurrence rate: 53%), and the total number of solder bridges in all fifth electrode groups E was eighty one (occurrence rate: 90%). Thus, the occurrence rate of solder bridges in Comparative Example 3 (treated substrate) was 1% at the lowest and far more than 50% (90%) at the highest.

Example 1 (Untreated Substrate)

With reference to Table 4, the occurrence of solder bridges in Example 1 (untreated substrate) will be described.

In the case of Example 1 (untreated substrate), the total number of solder bridges in all first electrode groups A was zero (occurrence rate: 0%), the total number of solder bridges in all second electrode groups B was zero (occurrence rate: 0%), and the total number of solder bridges in all third electrode groups C was six (occurrence rate: 6.7%). Also, in the case of Example 1 (untreated substrate), the total number of solder bridges in all fourth electrode groups D was twenty four (occurrence rate: 27%), and the total number of solder bridges in all fifth electrode groups E was twenty five (occurrence rate: 28%). Thus, the occurrence rate of solder bridges in Example 1 (untreated substrate) was 0% at the lowest and less than 30% (28%) at the highest.

Comparative Example 3 (Untreated Substrate)

With reference to Table 5, the occurrence of solder bridges in Comparative Example 3 (untreated substrate) will now be described.

In the case of Comparative Example 3 (untreated substrate), the total number of solder bridges in all first electrode groups A was seventy six (occurrence rate: 84%), the total number of solder bridges in all second electrode groups B was seventy six (occurrence rate: 84%), the total number of solder bridges in all third electrode groups C was seventy five (occurrence rate: 83%). Also, in the case of Comparative Example 3 (untreated substrate), the total number of solder bridges in all fourth electrode groups D was eighty one (occurrence rate: 90%), and the total number of solder bridges in all fifth electrode groups E was ninety (occurrence rate: 100%). Thus, the occurrence rate of solder bridges in Comparative Example 3 (untreated substrate) was 83% at the lowest and 100% (all) at the highest.

Comparison Between Examples and Comparative Examples

Examples 2 and 3 and Comparative Examples 1 and 2 also underwent the same testing and evaluation as those done for Example 1 and Comparative Example 3, though not specifically described.

Table 6 shows a list of evaluation results of soldering on the evaluation substrate 100 (either the treated substrate or the untreated substrate) using the solder products of Examples 1 to 3 and Comparative Examples 1 to 3. As regards the evaluation results for the treated substrate, "Good" in Table 6 means that the highest occurrence rate of solder bridges was equal to or less than 50%, and "Poor" in Table 6 means that the highest occurrence rate of solder bridges was more than 50%. As regards the evaluation results for the untreated substrate, "Good" in Table 6 means that the highest occurrence rate of solder bridges was equal to or less than 30%, and "Poor" in Table 6 means that the highest occurrence rate of solder bridges was more than 30%.

TABLE 6

| EXAMPLES/COMPARATIVE EXAMPLES | EVALUATION RESULTS | |
|---|---|---|
| | TREATED SUBSTRATE | UNTREATED SUBSTRATE |
| EXAMPLE 1 | GOOD | GOOD |
| EXAMPLE 2 | GOOD | GOOD |
| EXAMPLE 3 | GOOD | GOOD |
| COMPARATIVE EXAMPLE 1 | POOR | POOR |
| COMPARATIVE EXAMPLE 2 | POOR | POOR |
| COMPARATIVE EXAMPLE 3 | POOR | POOR |
| | (GOOD: 50% OR LESS) | (GOOD: 30% OR LESS) |

From Table 6, it can be seen that the occurrence rate of solder bridges is lower when the solder products of Examples 1 to 3, which underwent filtration by the filter 12 having the aperture size s of 10 μm or less, were used than when the solder products of Comparative Examples 1 and 2, which underwent filtration by the filter 12 having the aperture size s of 20 μm or more, were used. It can also be seen that the occurrence rate of solder bridges is lower when the solder products of Examples 1 to 3, which underwent filtration by the filter 12 having the aperture size s of 10 μm or less, were used than when the solder product of Comparative Example 3, which did not undergo filtration by the filter 12, was used.

(Viscosity)

Evaluation of viscosity will now be described. Here, the solder products of Example 1 and Comparative Example 3 were subjected to the viscosity evaluation.

[Measurement Method]

A method that was adopted for measuring the viscosity will be described.

First, a relevant solder product (the solder product of Example 1 or Comparative Example 3) was fed into a crucible made of alumina (not shown) and heated in an argon atmosphere to obtain a solder melt composed of the molten solder product. Then, the temperature of the solder melt within the crucible was adjusted to 300° C. Thereafter, the temperature of the solder melt was gradually lowered from 300° C. and its viscosity was measured with a known vibration type viscometer at every 5° C. until 220° C.

[Measurement Results]

Figure 17:
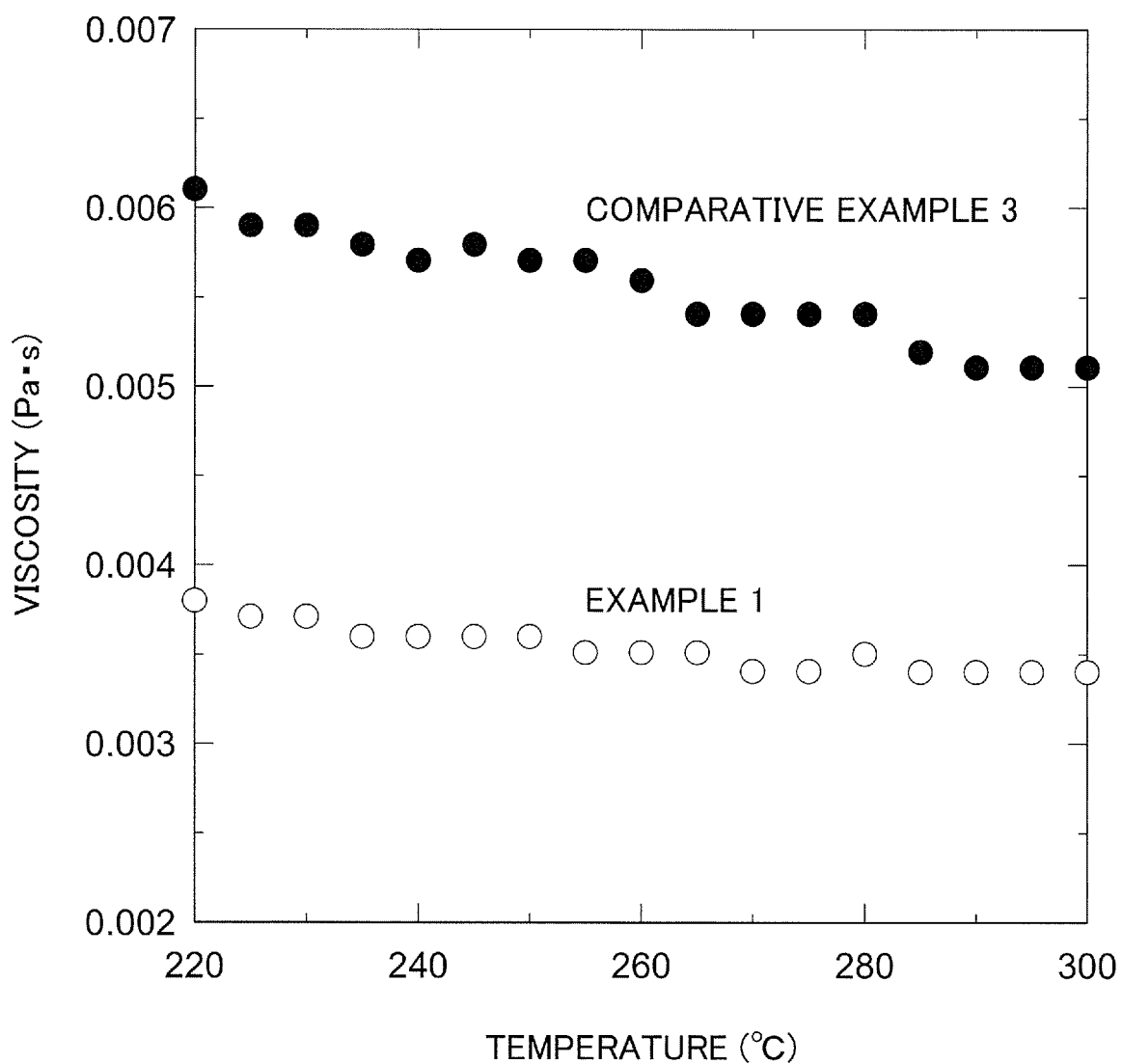
FIG. 17 illustrates viscosity-temperature relationship of a solder melt obtained by melting solder products of Example 1 and Comparative Example 1.

FIG. 17 illustrates viscosity-temperature relationship of the solder melt obtained by melting the solder products of Example 1 and Comparative Example 3. In FIG. 17, the horizontal axis represents the temperature (° C.), and the vertical axis represents the viscosity (Pa·s).

From the figure, it can be seen that both of Example 1 and Comparative Example 3 have a gradual increase in viscosity as the temperature decreases. However, in the temperature range between 220° C. and 300° C., the viscosity of Comparative Example 3 is always higher than Example 1 as the viscosity of Example 1 is about 0.0035 P·s to 0.004 P·s in that temperature range while that of Comparative Example 3 is about 0.005 P·s to 0.006 P·s in that temperature range. Such a lower viscosity at the same temperature may indicate that the solder melt obtained from the solder product of Example 1 can have both better solder wettability and better solder separation property than the solder melt obtained from the solder product of Comparative Example 3. In particular, having good solder separation property will contribute to reducing the occurrence of solder bridges described above.

(Oxygen Concentration)

Evaluation of oxygen concentration will now be described. Here, the solder products of Example 1 and Comparative Example 3 were subjected to the oxygen concentration evaluation.

[Measurement Method]

A method that was adopted for measuring the oxygen concentration will be described.

First, the same soldered evaluation substrate 100 as that used for the evaluation of solder bridges described above was prepared by the aforementioned procedure. The solder product of Example 1 or Comparative Example 3 was used as the raw material for the solder melt.

Then, the solder that migrated and adhered to the simulated electrode 110 on the evaluation substrate 100 was analyzed using a time-of-flight secondary ion mass spectrometry (ToF-SIMS) apparatus to obtain the oxygen concentration in the depth direction of the solder and an average oxygen concentration in the solder. For each of Example 1 and Comparative Example 3, three samples were prepared (Examples 1-1 to 1-3 and Comparative Examples 3-1 to 3-3).

[Measurement Results]

Figure 18A:
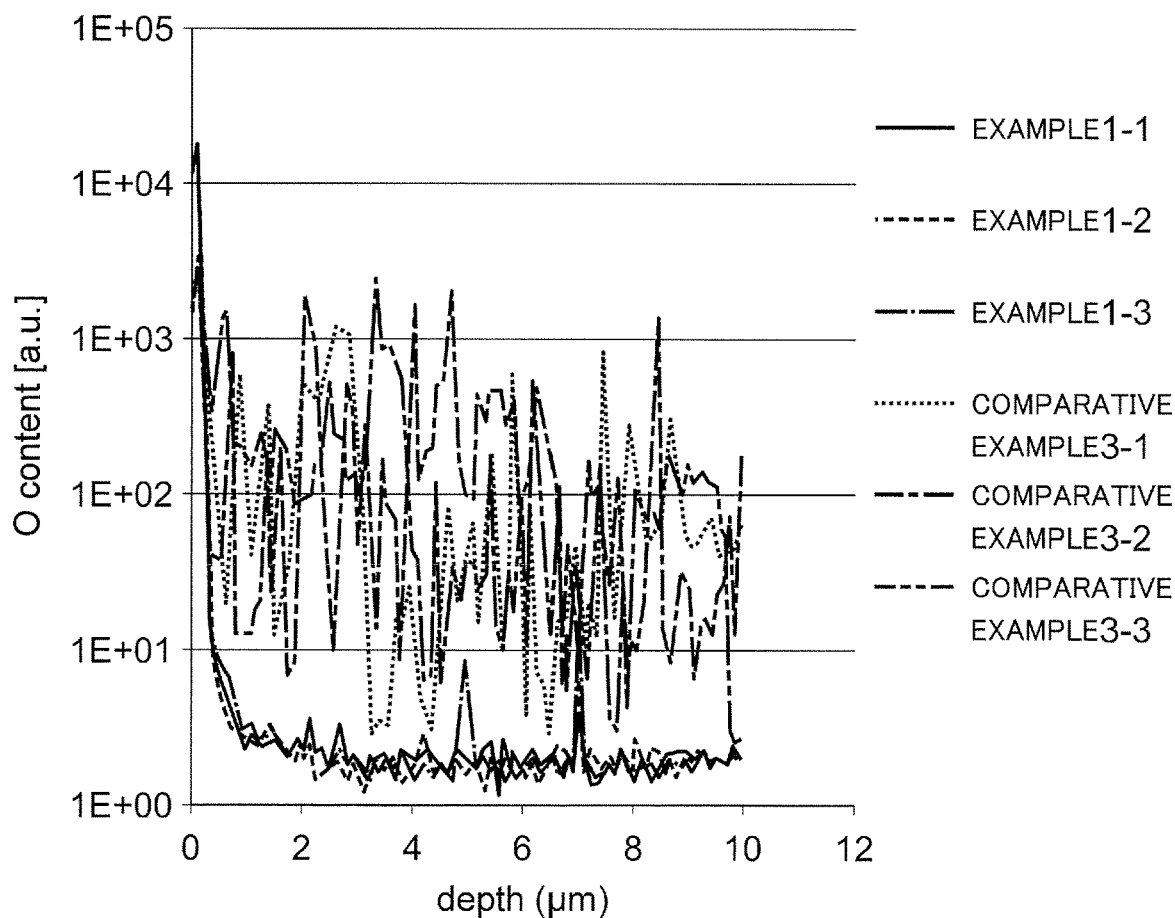
FIG. 18A illustrates oxygen concentration distribution in the depth direction of solders obtained by soldering the solder products of Example 1 and Comparative Example 3.
Figure 18B:
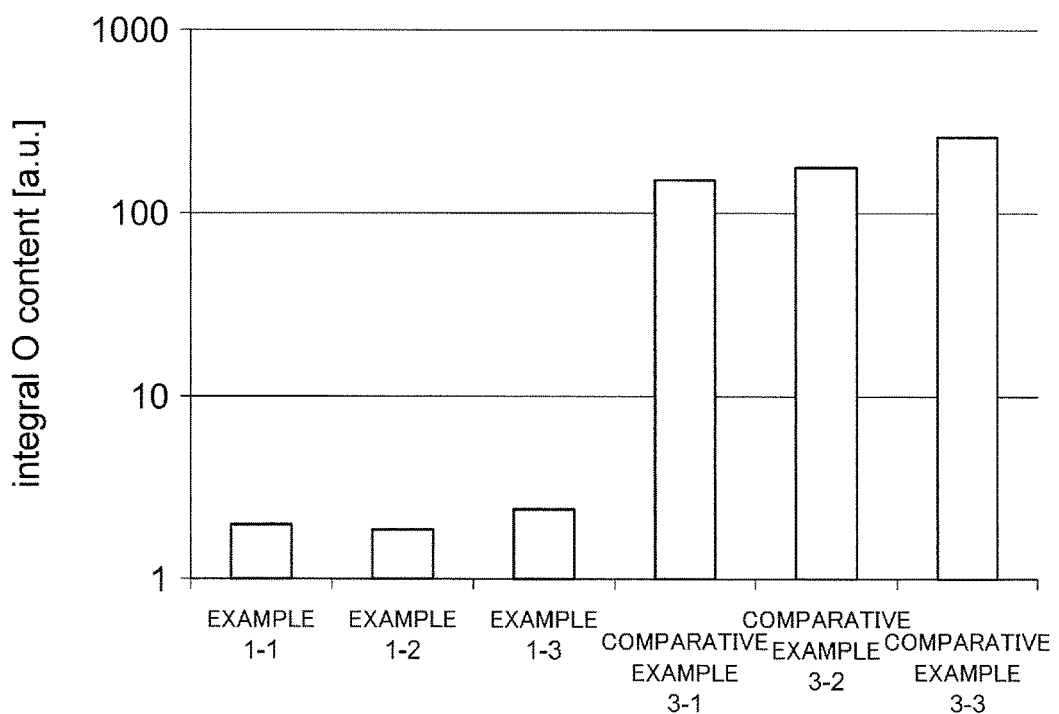
FIG. 18B illustrates an average oxygen concentration in each solder.

FIG. 18A illustrates oxygen concentration distribution in the depth direction of the solders obtained by soldering the solder products of Example 1 and Comparative Example 3. In FIG. 18A, the horizontal axis represents the depth from the solder surface (depth (μm)), and the vertical axis represents the oxygen concentration (O content [a.u.]). FIG. 18B illustrates an average oxygen concentration in each solder. In FIG. 18B, the horizontal axis represents the names of examples and comparative examples, and the vertical axis represents the average oxygen concentration (integral O content [a.u.]).

(Oxygen Concentration Distribution in the Depth Direction)

First, the oxygen concentration distribution in the depth direction of the solders will be described with reference to FIG. 18A.

As shown in FIG. 18A, in the case of the solder obtained by soldering the solder product of Example 1 (Examples 1-1 to 1-3), the oxygen concentration near the surface of the solder is relatively high, but the oxygen concentration at a depth of 1 μm or more from the surface is lower. In contrast, in the case of the solder obtained by soldering the solder product of Comparative Example 3 (Comparative Examples 3-1 to 3-3), the oxygen concentration in the solder is not particularly relevant to the depth and is generally high. In particular, attention is directed to the oxygen concentration at a depth of 1 μm or more from the surface, where the oxygen concentration in Examples 1-1 to 1-3 is one or two orders of magnitude lower than that in Comparative Examples 3-1 to 3-3.

(Average Oxygen Concentration)

With reference to FIG. 18B, the average oxygen concentration in the solder will be described.

From FIG. 18B, it can be seen that the average oxygen concentration in the solder obtained by soldering the solder product of Example 1 (Examples 1-1 to 1-3) is two orders of magnitude lower than that in the solder obtained by soldering the solder product of Comparative Example 3 (Comparative Examples 3-1 to 3-3).

(Oxygen in the Solder)

The above results may suggest that the solder obtained from the solder product of Example 1 can contain a smaller amount of metal oxides than the solder obtained from the solder product of Comparative Example 3. Containing a smaller amount of metal oxides in the solder equals reduced foreign materials (solids) that remain unmelted in the solder melt. Additionally, such reduction of foreign materials in the solder melt may suggest that both good solder wettability and good solder separation property can be achieved.

[Residue from the Filtration]

Figure 19:
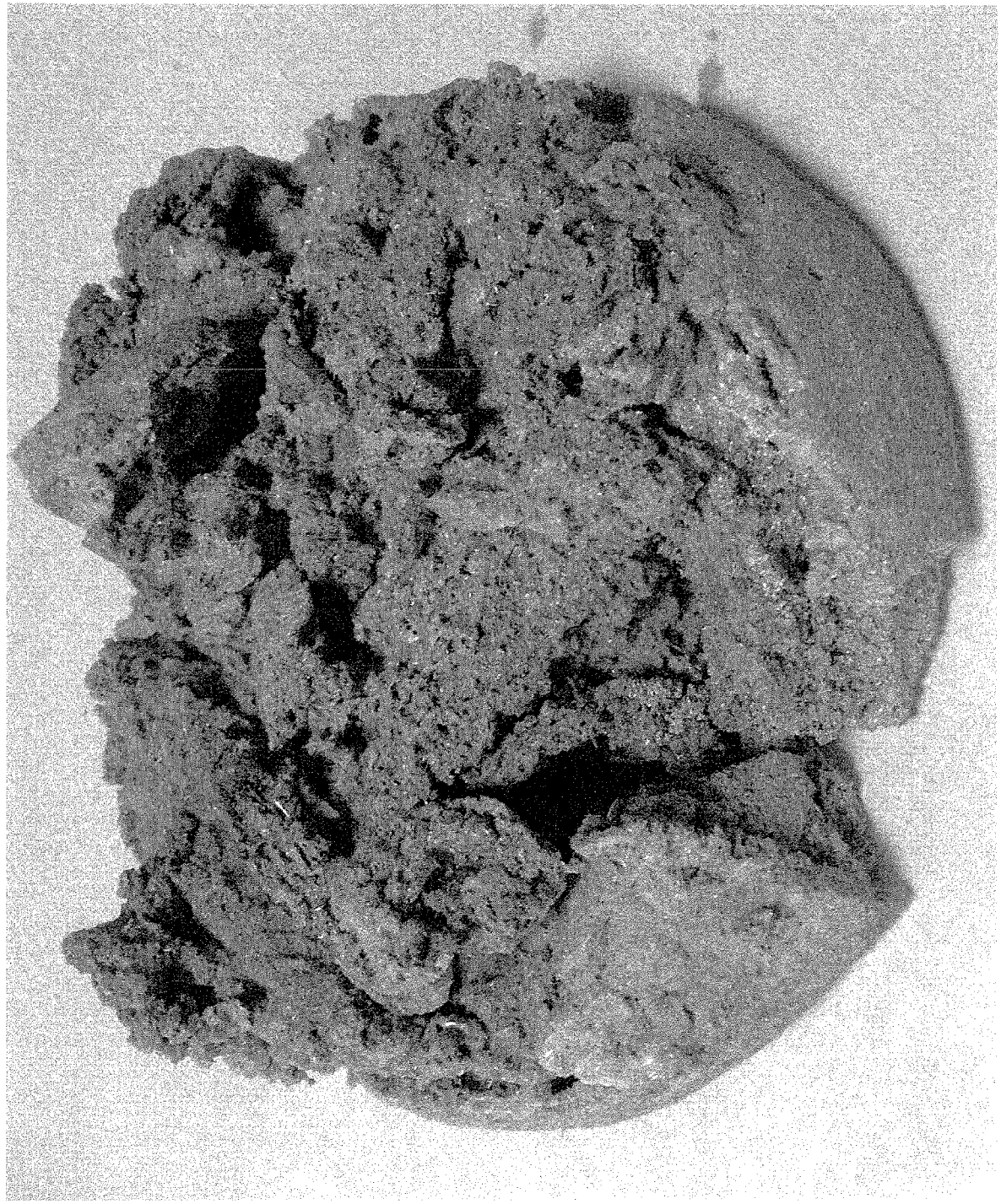
FIG. 19 is an optical photograph of a residue remaining on a filter after the filtration step in the manufacture of the solder product of Example 1.

FIG. 19 is an optical photograph of a residue remaining on the filter 12 after the filtration step of step 30 in the manufacture of the solder product of Example 1.

Figure 20:
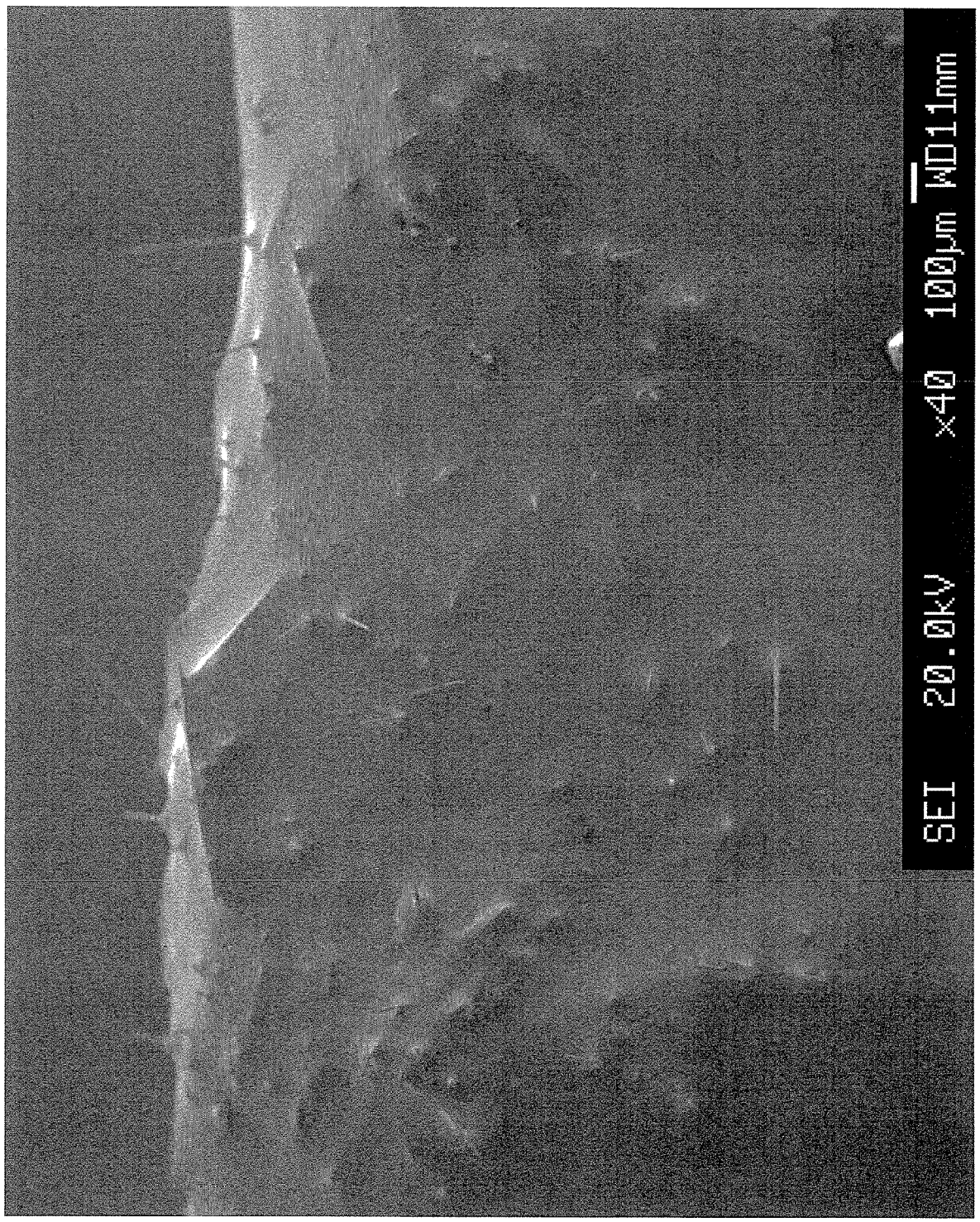
FIG. 20 is a scanning electron microscope (SEM) picture of the residue shown in FIG. 19.

FIG. 20 is a scanning electron microscope (SEM) picture of the residue shown in FIG. 19.

Figure 21:
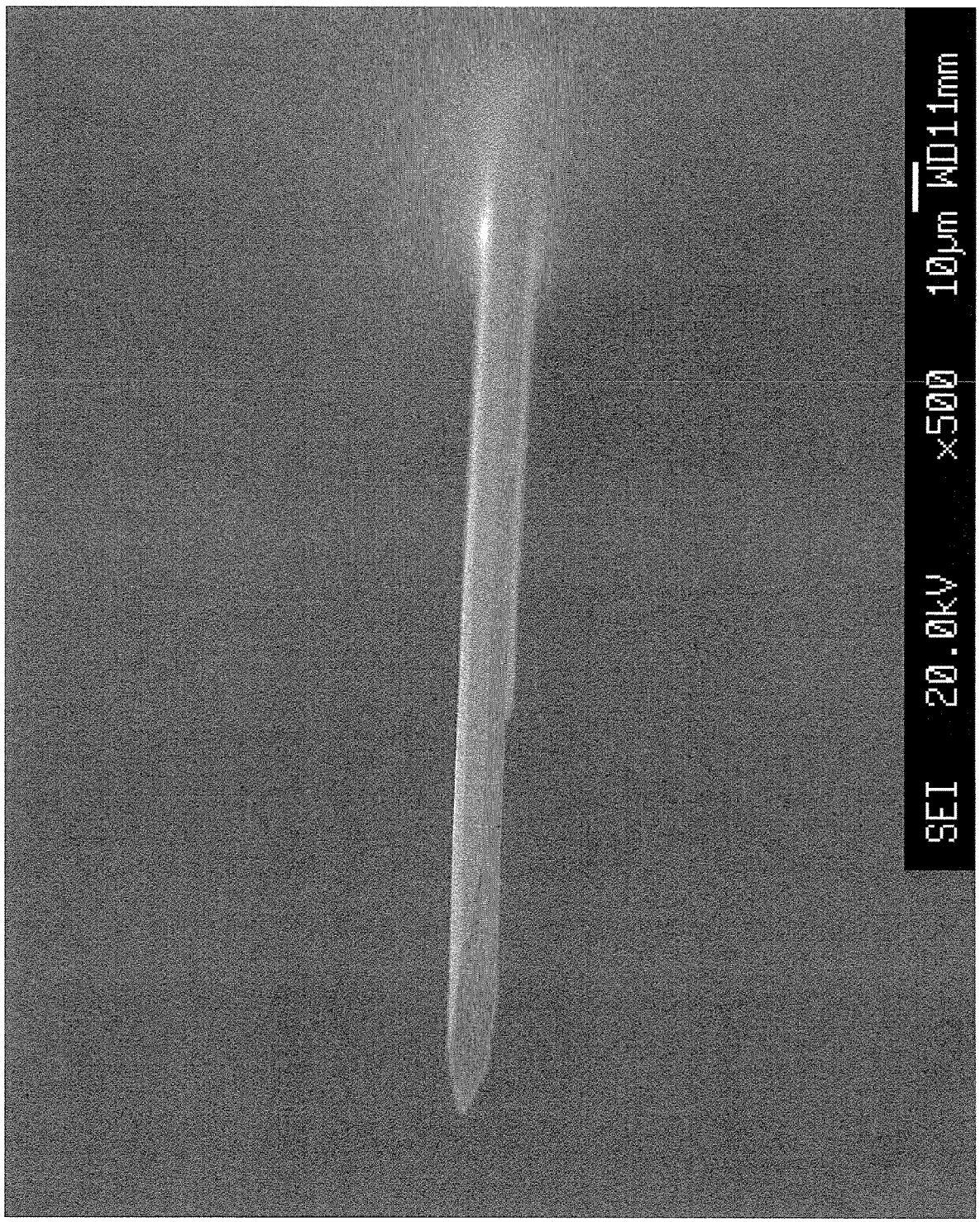
FIG. 21 is an SEM picture of an acicular body present in the residue shown in FIG. 20.

FIG. 21 is an SEM picture of an acicular body present in the residue shown in FIG. 20.

First, as shown in FIG. 19, the residue, as an example of solids, exhibits a generally grayish color and is in the form of an agglomerate made of sandy particles. Thus, as the look of the residue shown in FIG. 19 suggests, the residue may contain metal oxides.

Also, as shown in FIG. 20, the residue has a thorny surface like a cactus, so that acicular bodies of an acicular shape projects from the surface of the residue. However, these acicular bodies are considered to be actually present inside the residue, not only at the surface thereof.

Further, as shown in FIG. 21, each acicular body present in the residue has a length of about 100 μm to 200 μm and a diameter of about 12 μm to 20 μm. As is obvious from FIG. 21, the acicular body as a polygonal cross-section. This may suggest that the acicular body is composed of any single crystal.

An elemental analysis of the acicular body shown in FIG. 21 using an electron probe micro analyzer (EPMA) revealed that this acicular body contained both of tin and copper. This suggests that the acicular body is composed of a tin-copper alloy or a tin-copper oxide or the like. The present inventors conducted an experiment of heating the residue to 500° C., which showed that the acicular body present in the residue did not melt at 500° C. but maintained its form. Thus, this acicular body is considered not to be $Cu_6Sn_5$ (melting point: about 435° C.), which is a kind of tin-copper alloys.

Further, as is obvious from FIG. 21, the acicular body contained in the residue has a diameter greater than 10 μm, and thus the acicular body cannot pass through the filter 12 with the aperture size s of 10 μm or less. Hence, the solder products of Examples 1 to 3 are considered not to contain these acicular bodies as foreign materials.

Meanwhile, this acicular body can pass through the filter 12 with the aperture size s of 20 μm or more. Also, this acicular body can maintain its form in the absence of any filter 12. Hence, the solder products of Comparative Examples 1 to 3 are considered to contain these acicular bodies as foreign materials.

This is considered to be a cause of the solder products of Examples 1 to 3 yielding "Good" results in the solder bridge evaluation and the solder products of Comparative Examples 1 to 3 yielding "Poor" results in the solder bridge evaluation.

The diameter of the acicular body present in the residue was about 12 μm to 20 μm, as shown in FIG. 21. However, it seems that the diameter is not originally greater than 10 μm but it gradually increases along with the growth of the acicular body and then slows down its increase once reaching a certain diameter.

[Solder Product]

Below, a description will be given of features of the solder product that can be manufactured by the solder product manufacturing method described above.

The solder product is made of a solder raw material that is an alloy of a mixture of a plurality of metal elements. For example, when a solder raw material containing tin as a main component and a metal element other than lead as a secondary component is used, the solder product is an alloy that contains tin as a main component and the metal element other than lead as a secondary component. When, for example, copper is used as a secondary component of the solder raw material, the solder product is an alloy that contains copper as a secondary component.

The solder product is manufactured as follows: the alloy containing the mixture of a plurality of metal elements is melted to become a molten metal, solids derived from the alloy are removed from the molten metal, and then the molten metal is solidified. Thus, one feature of the solder product is that, when melted, it does not contain any residual solids derived from the alloy as they have already been removed. For example, in the case of the solder product manufactured through the aforementioned filtration step of filtering the molten metal with the filter 12 having the aperture size s of 10 μm to remove solids with the grain size of more than 10 μm from the molten metal, no solids with the grain size of more than 10 μm derived from the alloy constituting the solder product will remain in the molten metal of the alloy when it is melted. Likewise, in the case of the solder products manufactured through the filtration step of filtering the molten metal with the filters having the aperture sizes s of 5 μm and 3 μm to remove solids with the grain sizes of more than 5 μm and 3 μm, respectively, from the molten metal, no solids with the grain sizes of more than 5 μm and 3 μm derived from the alloys constituting the respective solder products will remain in the molten metal of the alloys when they are melted.

Table 7 shows results of studies on the amount of residual solids that remained when conventional and commercially available Sn—Cu based solder products were melted.

TABLE 7

| VENDOR | A | B | C | D |
| --- | --- | --- | --- | --- |
| WEIGHT OF SOLDER PRODUCT [kg] | 30 | 30 | 30 | 30 |
| WEIGHT OF SOLIDS [g] | 297 | 149 | 62 | 11 |
| WEIGHT AFTER FILTRATION [kg] | 29.550 | 29.750 | 29.932 | 29.976 |

As shown in Table 7, rod-like solder products available from vendors A, B, C and D were melted and filtered with the filter 12 having the aperture size s of 3 µm. As a result, solids of 11 g to 297 g per 30 kg of the solder product remained on the filter 12. Thus, when conventional and commercially available solder products are melted, even a high quality solder product will produce residual solids of at least more than 0.03 wt. %, and a low quality one will produce residual solids of as much as 0.99 wt. %. Since conventional solder products are manufactured without undergoing any filtration step, the above results would be the same when the filter 12 with the aperture size s of 10 µm is used.

In contrast, the solder product manufactured by the aforementioned solder product manufacturing method, which includes the step of removing solids from the molten metal, can be a high quality alloy that does not produce any residual solids over a certain grain size when it is melted. Thus, this solder product enables finer soldering as compared to conventional ones.

However, for effective use of low quality solder products, a solder product that does not contain solids over a certain grain size and a conventional solder product may be mixed to manufacture a new solder product. That is, in an application that requires improved quality over conventional solder products, a new solder product can be manufactured by mixing a conventional solder product with a solder product manufactured by the aforementioned solder product manufacturing method including the step of removing solids from the molten metal.

Specific examples of the solder products that can be manufactured in this manner include a solder product of an alloy in which solids with a grain size of more than 10 µm derived from the alloy that remain in the molten metal of the alloy when it is melted account for not more than 0.03 wt. % of the alloy before melting, a solder product of an alloy in which solids with a grain size of more than 5 µm derived from the alloy that remain in the molten metal of the alloy when it is melted account for not more than 0.03 wt. % of the alloy before melting, and a solder product of an alloy in which solids with a grain size of more than 3 µm derived from the alloy that remain in the molten metal of the alloy when it is melted account for not more than 0.03 wt. % of the alloy before melting.

A conventional solder product may be mixed in its raw material phase, besides mixing the conventional solder product itself sold on the market. Additionally, mixing of another metal element into the alloy having had solids removed therefrom by filtration or other means may take place either before or after solidification of the alloy. That is, for manufacture of the solder product, the molten metal having had solids removed therefrom by filtration or other means may be mixed with another metal element and then solidified, or alternatively, the molten metal having had solids removed therefrom by filtration or other means may be once solidified and then melted again to be mixed with another metal element.

Conversely, in an application that requires a high quality solder product that does not contain any solids over a certain grain size, the solder product may be manufactured without mixing another metal into the alloy having had solids removed therefrom by filtration or other means.

[Soldered Component]

Below, an example soldered component joined with the solder product manufactured by the aforementioned solder product manufacturing method will be described.

Figure 22:
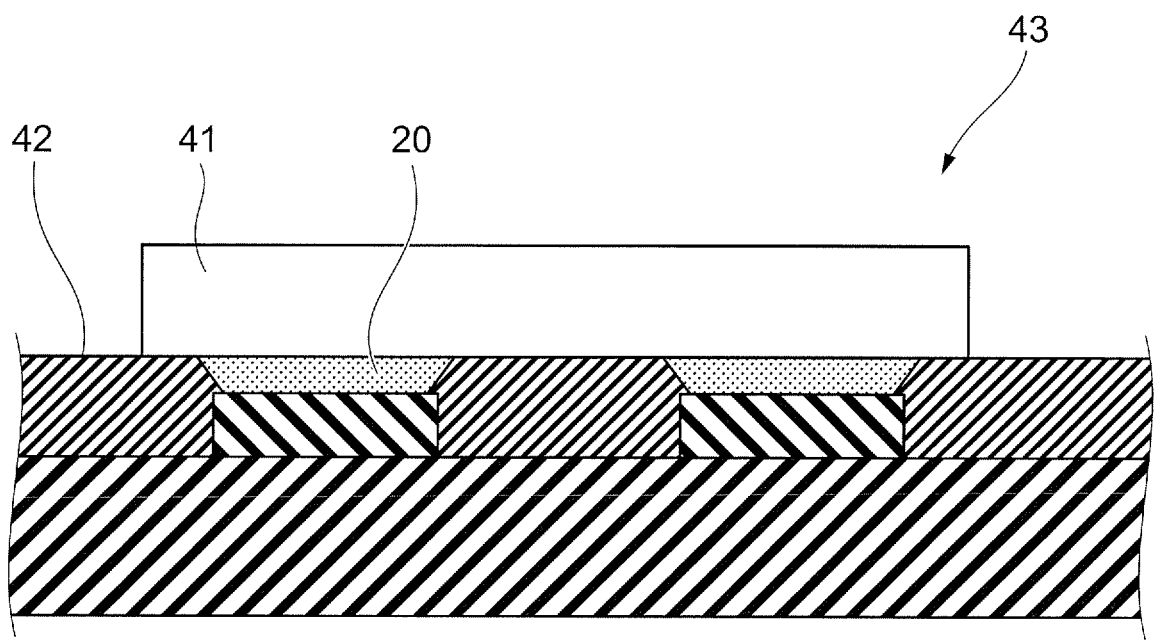
FIG. 22 illustrates an example of a soldered component joined by the solder product.

FIG. 22 is an example soldered component joined with the solder product.

As shown in FIG. 22, the soldered component 43 can be manufactured by joining an LED 41 onto a substrate 42 with the solder product 20. The solder product 20 in the melted state is filled into a solder pocket formed at a position on which the LED 41 is to be mounted. Thus, the LED 41 cannot be fixed to the substrate 42 in an appropriate orientation unless a grain size of solids that remain after melting the solder product 20 is at least smaller than the width and depth of the solder pocket, because the solids would otherwise project from the solder pocket.

In particular, an LED 41 having a light emitting portion sized at or below 100 µm is called a micro LED, whose maximum width is about 150 µm. In cases where the micro LED is joined onto the substrate 42 with the solder product 20, a solder pocket will have a width of about 50 µm and a depth of about 10 µm to 15 µm.

Accordingly, to solder the micro LED onto the substrate 42, it is required that solids remaining after melting the solder product 20 have a grain size of not more than 10 µm. However, even with each solid having the grain size of not more than 10 µm, the molten solder product 20 will bulge if a plurality of solids enter the pocket. This may cause a failure where the micro LED is joined in an inclined fashion. Thus, ensuring that solids remaining after melting the solder product 20 have a grain size of not more than 5 µm will help prevent this failure. According to an experiment actually conducted by the present inventors, if solids remaining after melting the solder product 20 have a grain size of not more than 3 µm, the micro LED can be stably soldered onto the substrate 42 with a greatly reduced possibility of the failure.

Besides the above soldered component 43 having the LED 41 joined onto the substrate 42 with the solder product 20, examples of the soldered component include printed wiring boards. For example, wiring patterns on printed wiring boards subject to soldering have recently been increasingly finer (thinner), in the smartphone industry and the like in particular. A so-called line/space (L/S) value of printed wiring boards has been lower than 100 µm since a few years ago, and these days printed wiring boards with the L/S value of 10 µm/10 µm are even contemplated.

When soldering is performed on a printed wiring board with the L/S value of 10 µm/10 µm, the presence of solids with the grain size of more than 10 µm in the molten metal of the solder product may cause the solder bridges described above. Thus, it is preferable that solids remaining after melting the solder product have the grain size of not more than 5 µm.

When soldering is performed on a printed wiring board with the L/S value of 10 µm/10 µm, the presence of acicular bodies with a diameter of a little less than 10 µm in the solder product as a solder source may cause the solder bridges described above. In view of this, it is preferable that the filter 12 with the aperture size s of not more than 5 µm is used in the filtration step of step 30, as in Examples 1 and 2 described above.

[Other Notes]

Although a particular embodiment has been described above, this is merely exemplary in nature and not intended to limit the scope of the invention. The novel methods and systems described herein may be implemented in various other forms. Various omissions, replacements, and changes may be made to the form of the methods and systems described herein, without departing from the spirit of the invention. The accompanying claims and their equivalents encompass such other various forms and modifications as being within the scope and spirit of the invention.

For example, the above embodiment has exemplarily described a binary solder product containing tin (main component) and copper (secondary component), called the Sn—Cu based solder product. However, other solder products containing tin as a main component can provide the same advantageous effects, though not specifically described herein.

Examples of binary solder products other than the Sn—Cu based solder product include Sn—Ag, Sn—Bi, and Sn—Zn based solder products. Examples of ternary solder products include Sn—Ag—Cu, Sn—Ag—Bi, Sn—Ag—In, Sn—Zn—Bi, and Sn—Zn—Al based solder products. Examples of quaternary solder products include Sn—Ag—Cu—Bi and Sn—Ag—In—Bi based solder products. Examples of quinary solder products include an Sn—Ag—Cu—Ni—Ge based solder product. Senary or higher-order solder products can also provide the same advantageous effects.

Although the above embodiment has exemplarily described the method of filtering the molten metal obtained by melting the solder raw material with the filter 12, other methods may be used to remove solids therefrom. For example, centrifugation, solid-liquid separation, or other similar methods may be used to remove from the molten metal solids having a diameter of more than 10 μm (more preferably more than 5 μm) and present within the molten metal.

The invention claimed is:

1. A method for manufacturing a solder product, the method comprising:
    a heating step of heating and melting a raw material to obtain a molten metal, the raw material containing tin as a main component, a metal element other than lead as a secondary component, and a carboxylic acid having 10 to 20 carbons;
    a removing step of removing, from the molten metal set to a pre-filtration temperature from 230° C. to 260° C., solids having a diameter of more than 10 μm and present within the molten metal by filtering the solids with a filter having an aperture size of not more than 10 μm, wherein the filter is heated by a heater, and a post-filtration temperature of the filtered molten metal is 230° C. to 260° C.; and
    a cooling step of cooling and solidifying the molten metal with the solids removed therefrom and depositing the carboxylic acid at a surface of the solder product to form a surface layer.

2. The method for manufacturing a solder product according to claim 1, wherein
    in the removing step, the molten metal is set to a pre-filtration temperature from 235° C. to 250° C.

* * * * *